US009837556B2

(12) United States Patent
Jergovic et al.

(10) Patent No.: US 9,837,556 B2
(45) Date of Patent: Dec. 5, 2017

(54) INTEGRATED PHOTOVOLTAIC PANEL WITH SECTIONAL MAXIMUM POWER POINT TRACKING

(71) Applicant: Volterra Semiconductor LLC, San Jose, CA (US)

(72) Inventors: Ilija Jergovic, Palo Alto, CA (US); Kaiwei Yao, San Jose, CA (US); Anthony J. Stratakos, Kentfield, CA (US)

(73) Assignee: Volterra Semiconductor LLC, San Jose, CA (US)

( * ) Notice: Subject to any disclaimer, the term of this patent is extended or adjusted under 35 U.S.C. 154(b) by 557 days.

(21) Appl. No.: 13/662,166

(22) Filed: Oct. 26, 2012

(65) Prior Publication Data

US 2013/0106194 A1     May 2, 2013

Related U.S. Application Data

(60) Provisional application No. 61/553,513, filed on Oct. 31, 2011.

(51) Int. Cl.
    *H01L 31/02*        (2006.01)
    *H01L 31/05*        (2014.01)
    (Continued)

(52) U.S. Cl.
    CPC .... *H01L 31/0201* (2013.01); *H01L 31/02021* (2013.01); *H01L 31/0504* (2013.01);
    (Continued)

(58) Field of Classification Search
None
See application file for complete search history.

(56) References Cited

U.S. PATENT DOCUMENTS

| 6,278,264 B1 | 8/2001 | Burstein et al. |
| 6,362,986 B1 | 3/2002 | Schultz et al. |

(Continued)

FOREIGN PATENT DOCUMENTS

| EP | 2280469 | 2/2011 |
| JP | H11103538 | 4/1999 |

(Continued)

OTHER PUBLICATIONS

Alonso et al., "Cascaded H-Bridge Multilevel Converter for Grid Connected Photovoltaic Generators with Independent Maximum Power Point Tracking of each Solar Array," PESC 2003, Jun. 15-19, 2003, pp. 731-735.

(Continued)

*Primary Examiner* — Daniel Kessie
(74) *Attorney, Agent, or Firm* — Lathrop & Gage LLP

(57) ABSTRACT

An integrated photovoltaic panel has one or more integral DC-DC converter circuits. The DC-DC converter input port couples to a section of at least one photovoltaic (PV) device of the panel separate from PV devices feeding other converters. The converter has an MPPT controller for operating the converter to transfer maximum power from coupled photovoltaic devices to its output port. The PV panel has a transparent substrate to which PV devices are mounted. A laminating material seals PV devices and converters to the substrate. In embodiments, the panel has multiple converters connected with output ports in series. The integrated PV panel provides summed maximum powers of each section of PV devices. In some embodiments the DC-DC converters are complete with inductors, in other embodiments a common inductor is shared by multiple converters of the panel, in a particular embodiment the common inductor is parasitic inductance of the panel.

52 Claims, 12 Drawing Sheets

(51) Int. Cl.
*H02J 3/38* (2006.01)
*H02S 40/32* (2014.01)

(52) U.S. Cl.
CPC .............. *H02J 3/385* (2013.01); *H02S 40/32* (2014.12); *Y02E 10/58* (2013.01); *Y10T 307/685* (2015.04); *Y10T 307/707* (2015.04)

(56) References Cited

U.S. PATENT DOCUMENTS

| | | | |
|---|---|---|---|
| 6,395,972 B1 | 5/2002 | Tran et al. | |
| 6,462,522 B2 | 10/2002 | Burstein et al. | |
| 7,126,053 B2 | 10/2006 | Kurokami et al. | |
| 7,900,361 B2 | 3/2011 | Adest et al. | |
| 7,940,032 B2* | 5/2011 | Kim | G05F 1/67 323/283 |
| 7,989,953 B1 | 8/2011 | Jergovic et al. | |
| 8,058,747 B2* | 11/2011 | Avrutsky | H02J 1/102 307/43 |
| 8,077,437 B2* | 12/2011 | Mumtaz | H01L 21/84 361/18 |
| 8,158,877 B2 | 4/2012 | Klein et al. | |
| 8,319,471 B2* | 11/2012 | Adest | 257/140 |
| 2002/0038667 A1* | 4/2002 | Kondo | H02J 3/383 136/244 |
| 2004/0118446 A1* | 6/2004 | Toyomura | H01L 31/042 136/244 |
| 2005/0121067 A1* | 6/2005 | Toyomura | H01L 31/02021 136/244 |
| 2007/0164612 A1* | 7/2007 | Wendt | H02J 1/10 307/45 |
| 2008/0121272 A1 | 5/2008 | Besser et al. | |
| 2008/0122449 A1 | 5/2008 | Besser et al. | |
| 2008/0122518 A1 | 5/2008 | Besser et al. | |
| 2008/0143188 A1 | 6/2008 | Adest et al. | |
| 2008/0164766 A1 | 7/2008 | Adest et al. | |
| 2008/0179949 A1 | 7/2008 | Besser et al. | |
| 2008/0191560 A1 | 8/2008 | Besser et al. | |
| 2008/0191675 A1 | 8/2008 | Besser et al. | |
| 2008/0236648 A1 | 10/2008 | Klein et al. | |
| 2008/0238195 A1* | 10/2008 | Shaver | H02H 9/041 307/18 |
| 2008/0303503 A1 | 12/2008 | Wolfs | |
| 2009/0283128 A1 | 11/2009 | Zhang et al. | |
| 2009/0284078 A1 | 11/2009 | Zhang et al. | |
| 2009/0284232 A1* | 11/2009 | Zhang | G05F 1/67 322/89 |
| 2009/0284240 A1 | 11/2009 | Zhang et al. | |
| 2009/0284998 A1* | 11/2009 | Zhang | G05F 1/67 363/55 |
| 2009/0289502 A1* | 11/2009 | Batarseh | H02J 1/102 307/44 |
| 2010/0032004 A1* | 2/2010 | Baker | F24J 2/5424 136/246 |
| 2010/0207455 A1 | 8/2010 | Erickson, Jr. et al. | |
| 2010/0253150 A1 | 10/2010 | Porter et al. | |
| 2010/0265747 A1 | 10/2010 | Egiziano et al. | |
| 2010/0288327 A1 | 11/2010 | Lisi et al. | |
| 2010/0313939 A1* | 12/2010 | Krein | H01L 31/0392 136/254 |
| 2010/0326492 A1 | 12/2010 | Tan et al. | |
| 2010/0327659 A1 | 12/2010 | Lisi et al. | |
| 2011/0036386 A1* | 2/2011 | Browder | H02S 40/32 136/244 |
| 2011/0062784 A1* | 3/2011 | Wolfs | G05F 1/67 307/77 |
| 2011/0084553 A1* | 4/2011 | Adest | H02J 1/102 307/63 |
| 2011/0084557 A1* | 4/2011 | Ger | H02J 3/383 307/82 |
| 2011/0225904 A1* | 9/2011 | Railkar | E04D 12/004 52/173.3 |
| 2012/0043818 A1 | 2/2012 | Stratakos et al. | |
| 2012/0043823 A1 | 2/2012 | Stratakos et al. | |
| 2012/0043923 A1 | 2/2012 | Ikriannikov et al. | |
| 2012/0044014 A1 | 2/2012 | Stratakos et al. | |
| 2012/0119586 A1* | 5/2012 | Carralero | H02J 1/102 307/82 |
| 2012/0212064 A1 | 8/2012 | Spanoche et al. | |
| 2012/0223584 A1* | 9/2012 | Ledenev | H01L 31/02021 307/82 |
| 2012/0255596 A1* | 10/2012 | Korman | F24J 2/5207 136/251 |
| 2015/0130284 A1* | 5/2015 | Ledenev | H02J 1/102 307/82 |

FOREIGN PATENT DOCUMENTS

| | | | | |
|---|---|---|---|---|
| WO | WO 2006/005125 | | 1/2006 | |
| WO | WO 2008/097591 | | 8/2008 | |
| WO | WO2011019936 | | 2/2011 | |
| WO | WO 2011019936 A1 * | | 2/2011 | ............... F24J 2/461 |

OTHER PUBLICATIONS

Barchowsky et al., "A Comparative Study of MPPT Methods for Distributed Photovoltaic Generation," PES 2012, Jan. 16-20, 2012, pp. 1-7.

Erickson, Robert W., "Future of Power Electronics for Photovoltaics," Applied Power Electronics Conference and Exposition, Feb. 18, 2009, 23 pages.

Fahrenbruch, S., "Active Bypass Diodes," Intersolar 2010, Jul. 14, 2010, 26 pages.

Pulvirenti et al., "DC-DC Converters with MPPT control for Photovoltaic Panels," 25th EU PVSEC/WCPEC-5, Sep. 7, 2010, 8 pages.

Pulvirenti et al., poster, "DC-DC Converters with MPPT control for Photovoltaic Panels," 25th EU PVSEC/WCPEC-5, Sep. 7, 2010, 1 page.

Saha et al., "ST and Solar Photovoltaic," date unknown, but Applicant notes that www.archive.org suggests that this document was posted at least as of Jan. 19, 2010, 22 pages.

Shmilovitz et al., "Distributed Maximum Power Point Tracking in Photovoltaic Systems—Emerging Architectures and Control Methods," Automatika vol. 53-1012 No. 2, Jun. 2012, pp. 142-155.

ST SPV1020 datasheet, Interleaved DC-DC boost converter with built-in MPPT algorithm, Copyright 2010, 18 pages.

TIGO Energy Module Maximizer-EP (MM-EP) Data Sheet, Copyright 2009, 2 pages.

Walker et al., "Cascaded DC-DC Converter Connection of Photovoltaic Modules," IEEE Trans. on Power Electronics, Jul. 2004, pp. 1130-1139.

Web page, "National Semi SolarMagic Technology—greenpowerZone," retrieved from www.en-genius.net/site/zones/greenpowerZone/product_reviews/grnpowp_071408 on Jun. 29, 2009, 3 pages.

Wolfs et al., "Distributed Maximum Power Tracking for High Performance Vehicle Solar Arrays," AUPEC 2004, Sep. 2004, 6 pages.

PCT/US12/62386 International Search Report & Written Opinion mailed Feb. 19, 2013, 14 pages.

Taiwanese Patent Application No. 101139998, Office Action mailed Jan. 15, 2015 and English-language translation thereof, 8 pages.

Chinese Patent Application No. 201280062199.X, Office Action issued Dec. 7, 2015 and English-language translation thereof, 33 pages.

Chinese Application No. 201280062199.X Office Action dated Apr. 3, 2015 with English Translation, 31 pages.

\* cited by examiner

INTEGRATED PHOTOVOLTAIC PANEL WITH SECTIONAL MAXIMUM POWER POINT TRACKING

RELATED APPLICATIONS

This application claims benefit of priority to U.S. Provisional Patent Application Ser. No. 61/553,513, filed Oct. 31, 2011, which is incorporated herein by reference.

Further discussion of panel-wide energy-storage inductors with incomplete, inductorless, buck-type DC-DC converters is available in U.S. Provisional Patent Application Ser. No. 61/375,012 filed Aug. 18, 2010, the contents of which are incorporated herein by reference.

FIELD

The present document relates to the field of photovoltaic panels with integral electronics.

BACKGROUND

Photovoltaic (PV) panels are often used to recharge batteries, or to provide power to the grid through grid-tie inverters. PV panels often, however, provide less output power than expected from known device efficiency and illumination.

One reason that PV panels may deliver less than optimum power is that their best power output under typical conditions is often at a voltage that is not well matched to battery charging voltages, or other constant-voltage loads. This happens in part because typical panels are temperature sensitive, they must have sufficient cells connected in series to provide battery charging voltage at high temperatures, this cell count becomes excessive at low temperatures where PV cells produce their best output voltage. Similarly, best power output voltage may change with illumination changes. Other losses occur when any one series-connected PV cell in a panel generates less current than other cells in the panel—barring additional circuitry, the output current of a series string of PV cells is effectively limited by photocurrent produced in the weakest, or most shaded, cell.

Since shading affects photocurrent produced in cells, often limiting current production of a series string of cells to that of a most-shaded cell of the string, un-shaded cells in the same series strings may yield substantially less power than they are otherwise capable of. Further, shading of cells may vary with time of day, sun angle, obstruction position, and even the position of wind-blown leaves or other debris on a panel.

Maximum Power Point Tracking (MPPT) devices are frequently connected between an array of PV panels and a load, such as a battery. They typically have a DC-DC converter that converts an input power at a panel voltage to an output power for the load at a load voltage, and control circuitry that seeks to find a panel voltage at which the array of PV panels produces maximum power. The DC-DC converter of the MPPT device serves to decouple the panel and load voltages.

Typically, MPPT devices are not embedded within panels, but are separate devices wired between an output of a panel, or an array of panels, and the load.

SUMMARY

An integrated photovoltaic panel has an integral DC-DC converter circuit with inputs adapted for coupling to at least one photovoltaic device, a first switching device, a first and second output, and a freewheel device. The converter also has a control unit adapted to control switching of the first switching device. The PV panel has a transparent substrate to which PV devices are mounted, at least one PV device feeds the DC-DC converter. A laminating material seals the first PV device and the first converter circuit to the transparent substrate. In other embodiments, the panel has multiple DC-DC converter circuits connected with outputs in series, each converter circuit connected to separate PV devices. In some embodiments the DC-DC converters are complete with inductors, in other embodiments a common output inductance is shared by multiple DC-DC converters of the panel, in a particular embodiment the common output inductance is parasitic inductance of the panel.

An integrated photovoltaic panel has an integral DC-DC converter circuit with inputs adapted for coupling to at least one photovoltaic device, a first switching device, a first and second output, and a freewheel device. The converter also has a control unit adapted to control switching of the first switching device. The PV panel has a transparent substrate to which PV devices are mounted, at least one PV device feeds the DC-DC converter. A laminating material seals the first PV device and the first converter circuit to the substrate.

An alternative integrated PV panel has a transparent substrate, and several sections of PV devices and electronics bonded to the substrate. Each section has multiple PV devices, each PV device with at least one PV cell, the PV devices of each section are electrically coupled in series to an electric circuit carrier, such as a printed circuit board (PCB) assembly having terminals for connection to the PV devices and embodying a converter circuit. The converter circuit embodied on or in the electric circuit carrier has at least a first switching device, a freewheel device, and a control unit adapted to control switching of the first switching device to optimize power transfer to the converter circuit from PV devices. Outputs of the converter circuits are outputs of the sections and are electrically connected in series and to panel terminals.

DETAILED DESCRIPTION OF THE EMBODIMENTS

Figure 1:
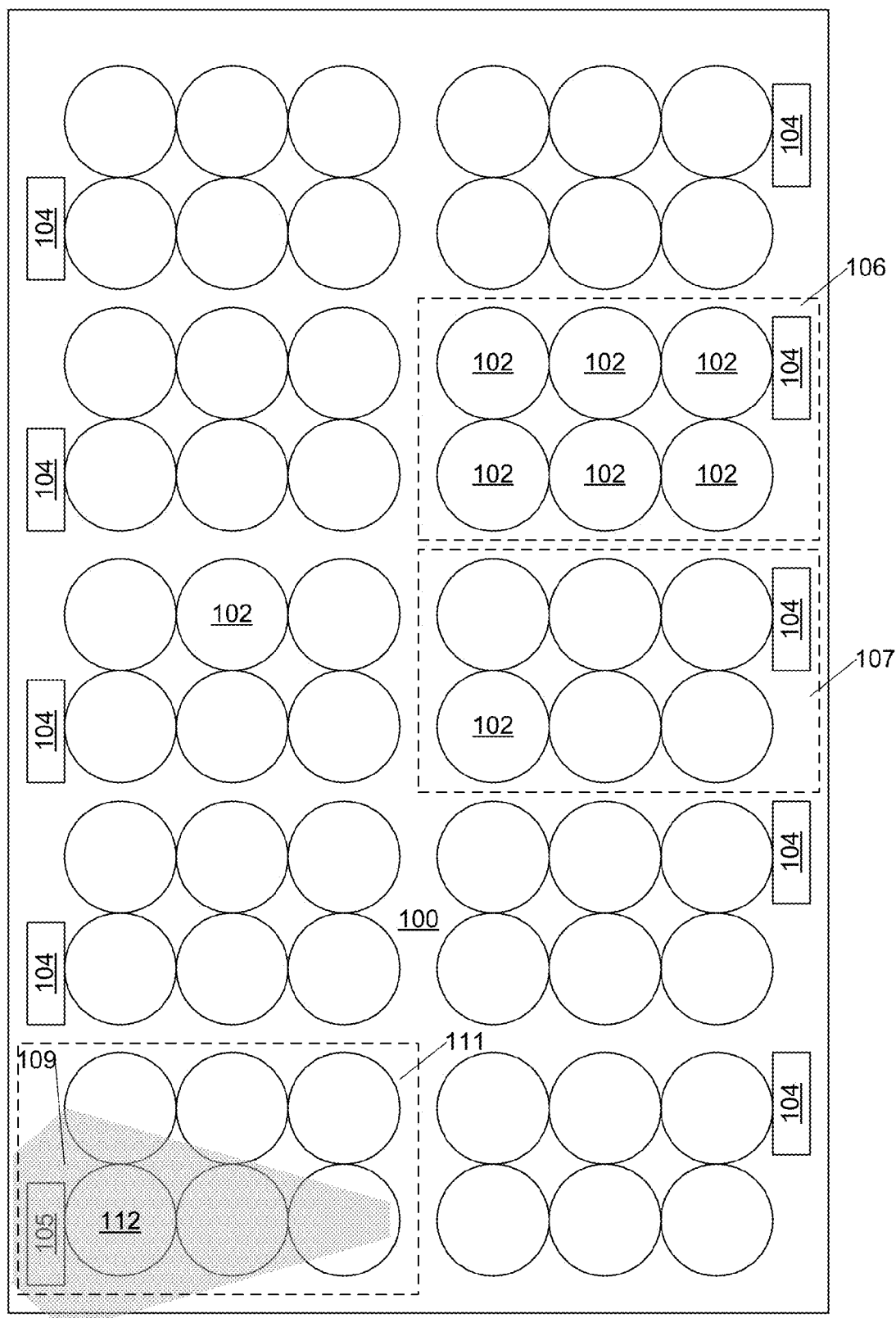
FIG. 1 is a top plan sketch of an integrated photovoltaic (PV) panel having multiple sections each having several PV cells and a MPPT control device.

An integrated photovoltaic (PV) panel 100 is illustrated in FIG. 1. This panel has a quantity of PV cell units 102, such as may be manufactured from single-crystal silicon, although alternative embodiments may have PV cell units comprising other materials including II-VI, III-V, and I-III-VI materials such as copper indium gallium diselenide. In an embodiment, the PV cell units are fabricated as single cells, in an alternative embodiment each of the cell units are constructed of multiple PV cells in single-layer or multiple-layer form and may have integrated series and/or parallel interconnect internal to each cell unit. Each cell unit has at least one positive terminal and at least one negative terminal through which power generated from light incident on the cell unit can be extracted from the cell unit.

Figure 2:
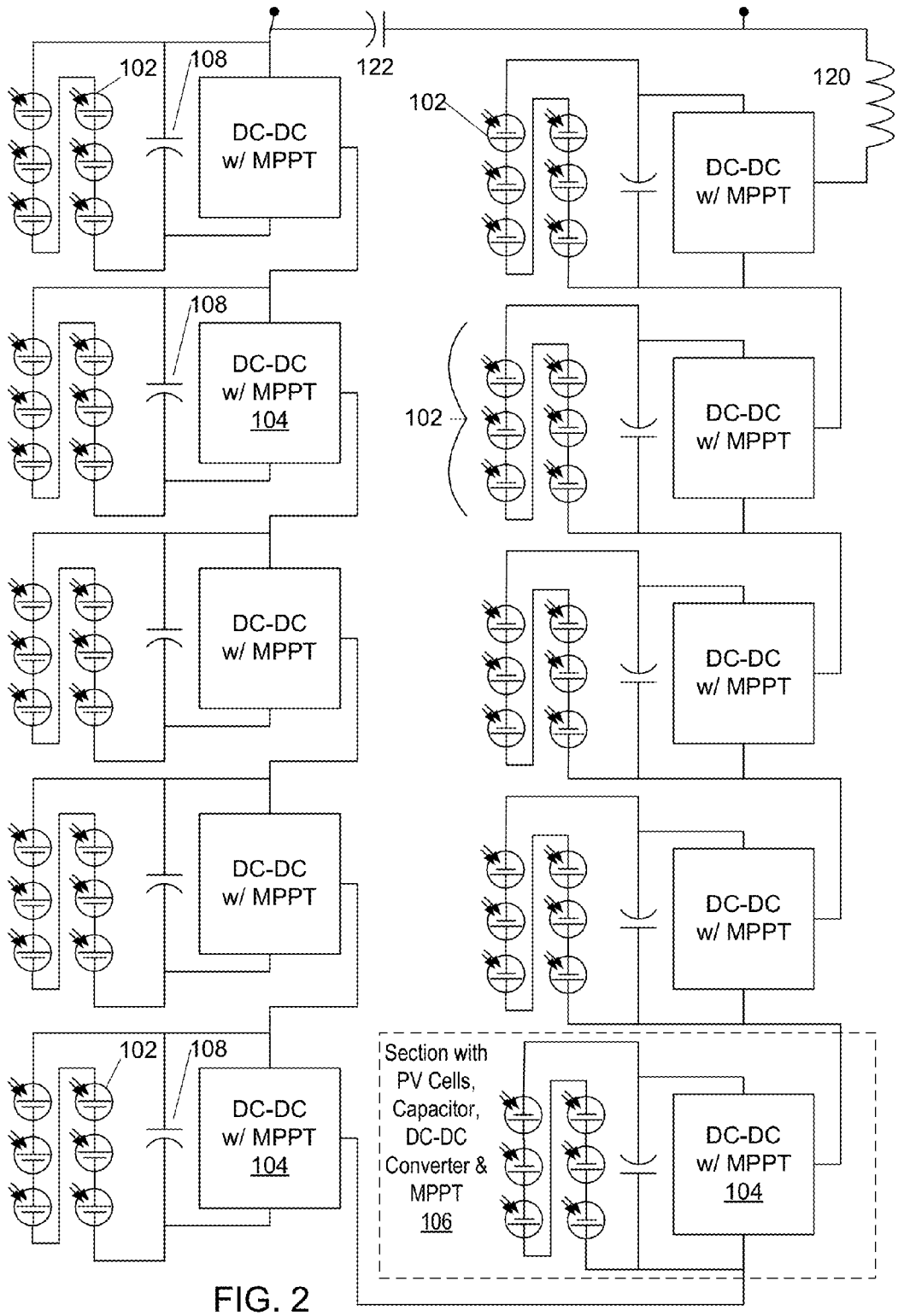
FIG. 2 is an electrical schematic of an embodiment of the PV panel of FIG. 1.

The cell units 102 are organized into several sections, such as section 106 and section 107, where each section has at least one cell unit 102, and typically has several cell units 102, together with one MPPT controller and DC-DC converter device 104 per section 106, 107. The cell units 102 of each section are interconnected, typically by tinned-copper tabbing ribbon wire, to form a photovoltaic portion which provides power to an input port of the converter device 104 as illustrated in FIG. 2. In many embodiments, one or more filtering capacitors 108 are provided at the input to each converter device 104. In the embodiment of FIG. 2, output ports of the DC-DC converter devices 104 are coupled together in series. While the DC-DC converters have input ports typically with two terminals, and output ports typically with two terminals, in many embodiments (including the embodiment illustrated in FIG. 2) one terminal of each port may be coupled together in common. Alternatively, fully isolated converters may be used where input and output ports each have two terminals, and no terminal of the input port is coupled to terminals of the output port. Additional communications or control ports may also be provided on the DC-DC converters.

During operation, a panel such as that of FIG. 1 may have none or more temporary shaded regions, such as arrowhead-shaped region 109 representing a shadow such as may be cast by a branch of a tree; further, these shaded regions may shift from one to another PV device unit 102, or from one section 111 to another section 106, 107 with time of day or with changes in the wind. At any given time, more than one section may be shaded or only a part of any section may be shaded. In some systems, shadowing may be both repeatable and predictable and, in some systems, repeatable shadowing may warrant a specific wiring topology of sections 106/107 to optimize the output power of the panel under such a repeatable shadow pattern.

In alternative embodiments, outputs of the DC-DC converter devices 104 of the sections are coupled together in a parallel or a series-parallel configuration instead of in the strictly serial configuration as illustrated in FIG. 2.

Figure 5:
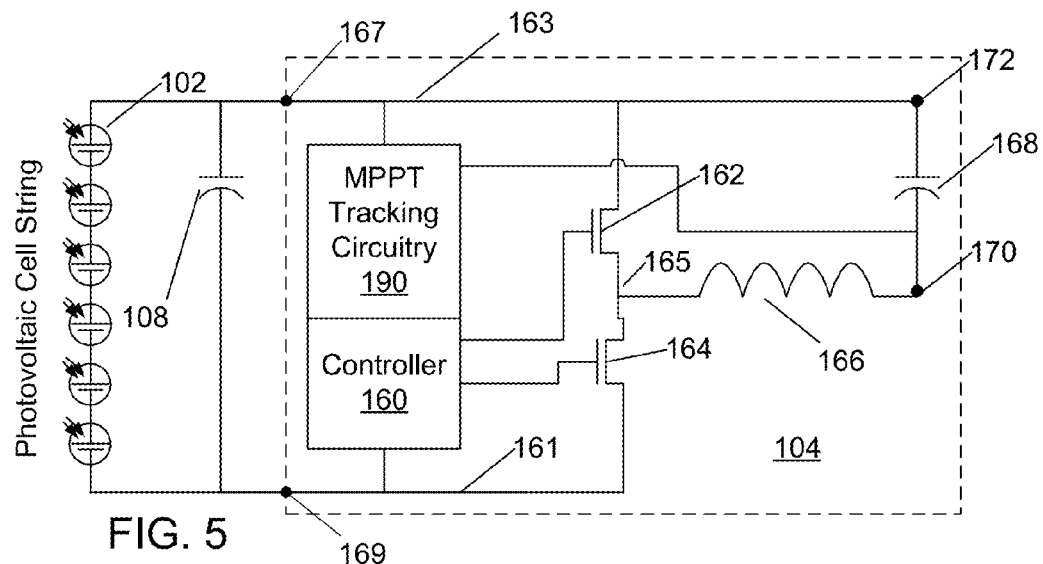
FIG. 5 is an electrical schematic of a section having an MPPT controller and complete DC-DC converter.

In an embodiment of FIG. 2, the DC-DC converter devices 104 may incorporate complete buck-type DC-DC downconverters, as illustrated in FIG. 5. Each converter device 104 has a controller 160, a first switching or active device 164 capable of coupling power from cell units 102 received through a first input 169 node 161 to an intermediate node 165 under control of controller 160, a second switching or active device 162 operable as a freewheeling device between intermediate node 165 and a second node 163, an inductor 166 coupled between the intermediate node 165 and an output node having an output terminal 170, and an output filtering capacitor 168. A second input 167 acts as a return for the first input 169. A second output terminal 172 is coupled to second active device 162, capacitors 168, 108, and PV cell units 102. In this embodiment, no panel-wide energy-storage inductor 120 (FIG. 2) is required. A panel output capacitor 122 may optionally be provided to reduce radiation of electrical noise generated by the DC-DC converters 104.

Four terminal DC-DC converters having first 169 and second 167 inputs, and first 170 and second 172 outputs, may be used in this architecture. For convenience in a particular embodiment and as illustrated in FIG. 5, input 167 has been connected to second output 172, however other configurations are possible and may be required with different converter types.

Figure 6:
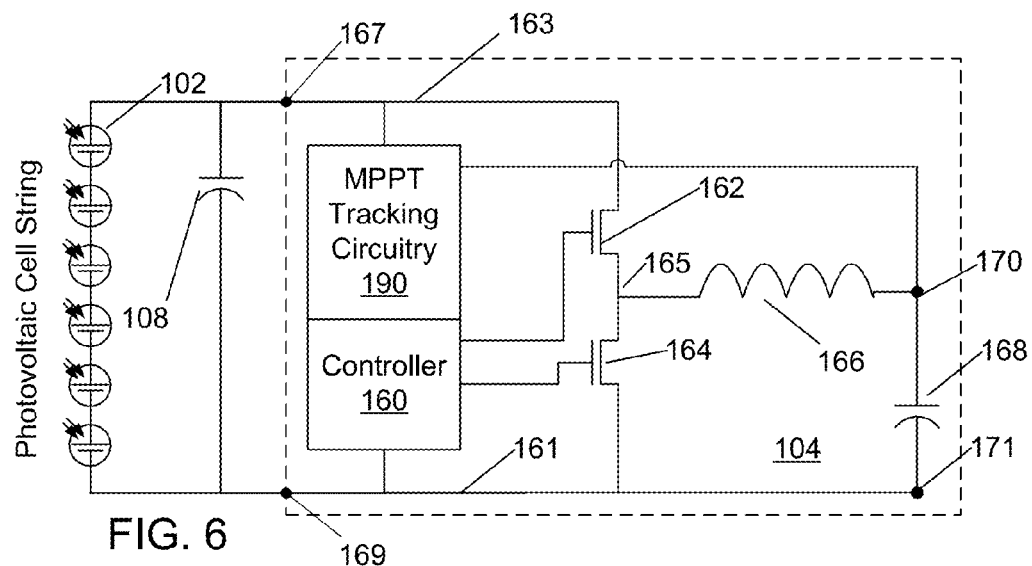
FIG. 6 is an electrical schematic of a section having an MPPT controller and a different configuration of buck converter.

While FIG. 5 illustrates an inverted-buck converter architecture, other DC-DC converter configurations are possible. For example, FIG. 6 illustrates a non-inverted or normal buck-converter architecture which is also expected to operate in an integrated panel, with converter output 171 tied through node 161 to input 169, but input 167 is not connected to second output 170.

Figure 3:
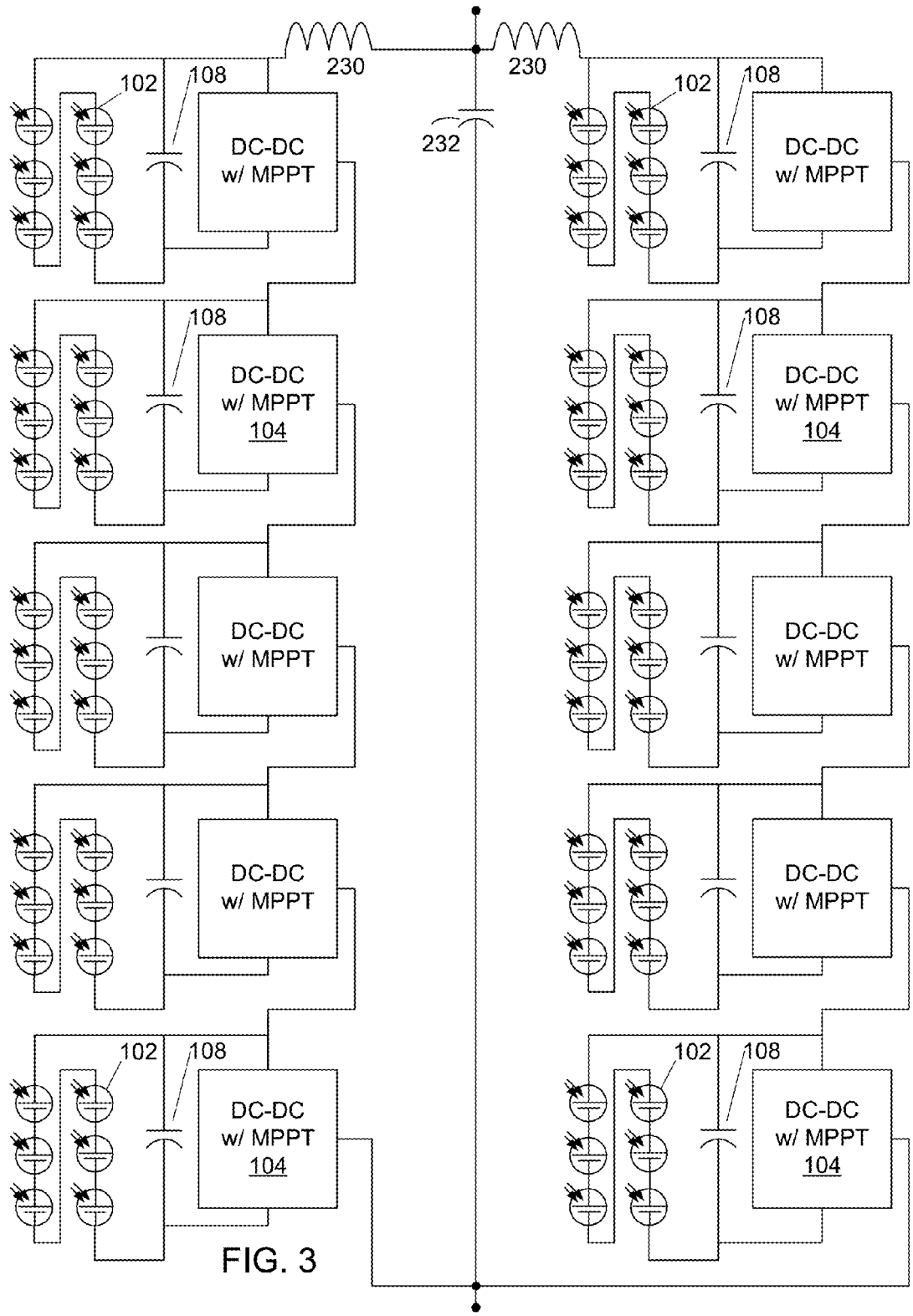
FIG. 3 is an electrical schematic of an embodiment in which converter outputs are coupled in series-parallel configuration.
Figure 4:
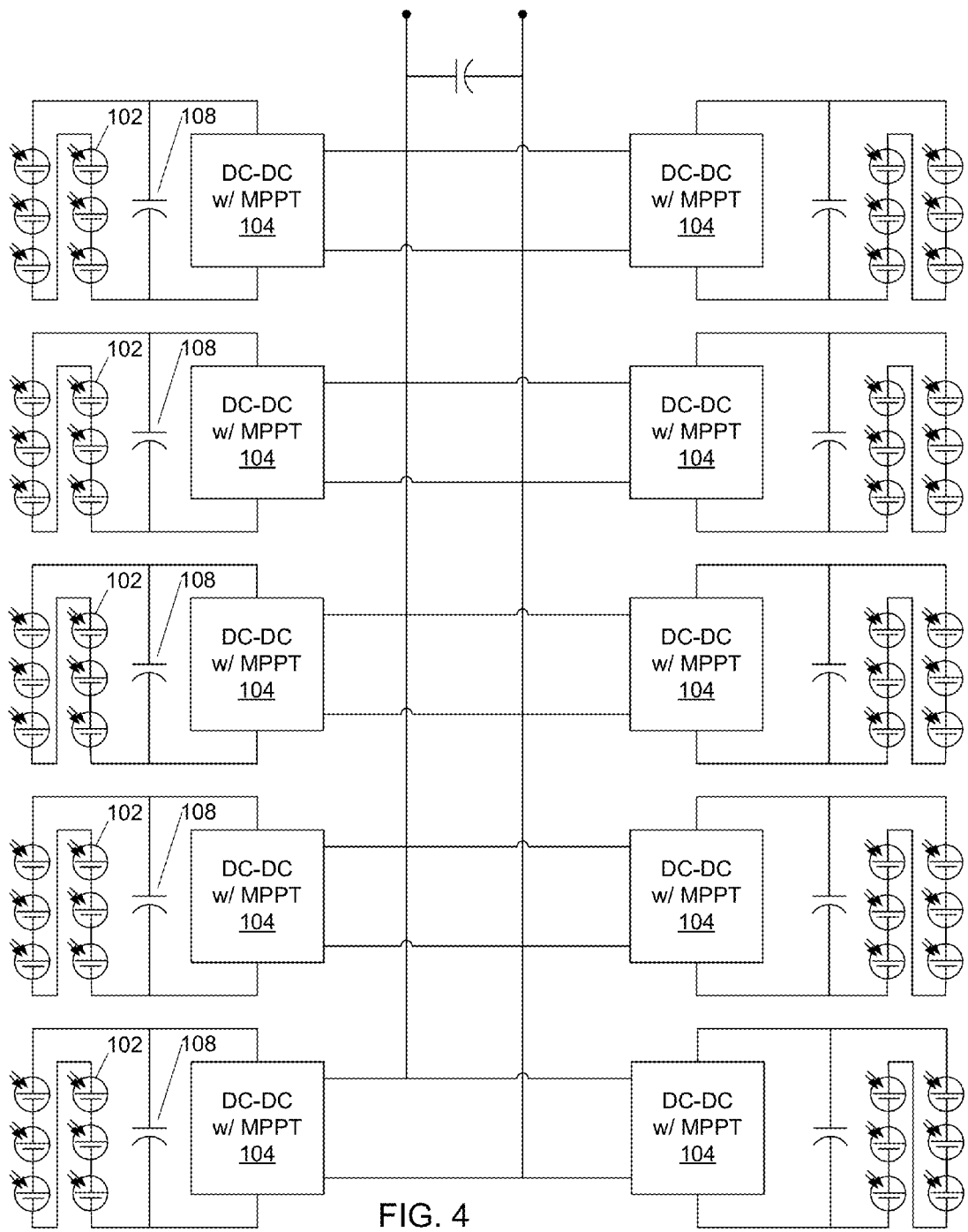
FIG. 4 is an electrical schematic of an embodiment in which converter outputs are coupled in parallel configuration.
Figure 7:
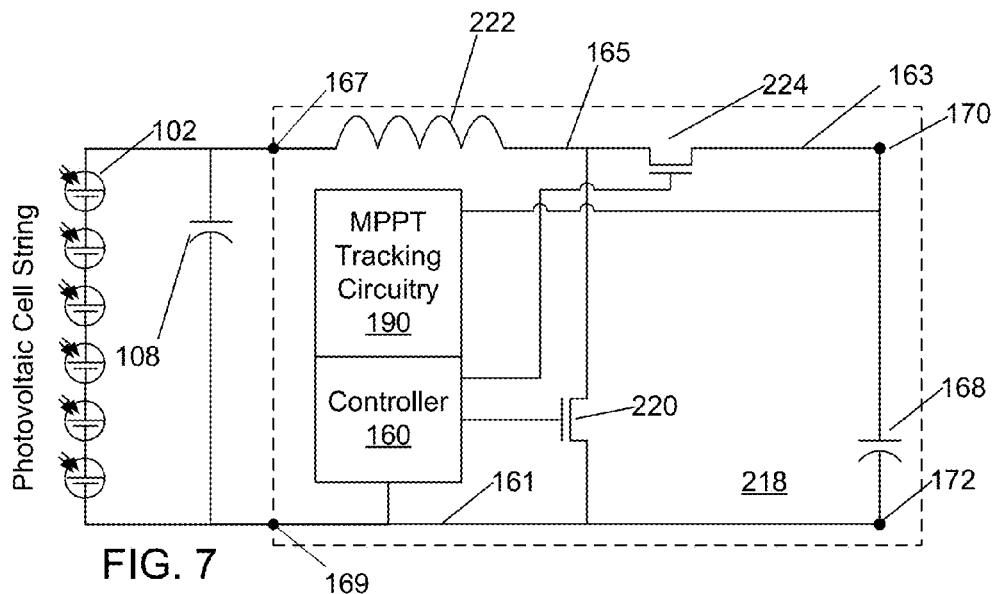
FIG. 7 is an electrical schematic of a section having an MPPT controller and a boost converter.

FIG. 7 illustrates an alternative embodiment using a boost converter 218 that is applicable to embodiments similar to those of FIGS. 2, 3, and 4, with higher voltage outputs, and particular applicability to a parallel embodiment such as that illustrated in FIG. 4. The boost converter operates by alternately closing and then opening first switching or active device 220, when active device 220 is closed current builds up in inductor 222. When active device 220 opens, current continues to flow in inductor 222 for a time, causing conduction through freewheel device 224 and causing current to flow through output 170.

Figure 8:
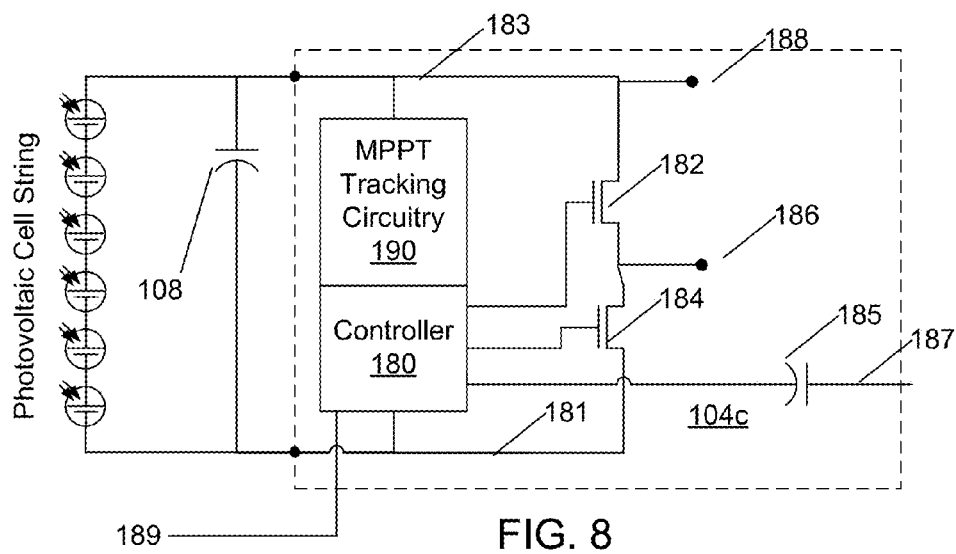
FIG. 8 is an electrical schematic of a section having an MPPT controller and a shared-inductor converter.

In an alternative embodiment of FIG. 2, the DC-DC converter devices 104 implement partial, inductorless, sections of buck-type DC-DC downconverter as illustrated in FIG. 8. In this embodiment, each converter device 104c has a controller 180, a first active or switching device 184 capable of coupling power from cell units 102 received through a first node 181 to an output terminal 186 under control of controller 180, and a second switching or active device 182 operable as a freewheeling device between output terminal 186 and a second node 183. A second output terminal 188 is coupled to second active device 182, capacitor 108, and PV cell units 102. In this embodiment, a single energy-storage inductor 120 and output capacitor 122 may be provided, which in a particular embodiment are sealed within the panel. In an alternative embodiment, energy storage inductor 120 and output capacitor 122 are external to, but associated with and electrically coupled to, the panel, and may be located in a terminal box associated with the panel. Further discussion of panel-wide energy-storage inductors with incomplete, inductorless, buck-type DC-DC converters is available in U.S. Provisional Patent Application Ser. No. 61/375,012 filed Aug. 18, 2010. In yet another alternative embodiment, switching of the inductorless converters is at a sufficiently high frequency that parasitic inductance of the ribbon wire and busbars of the panel suffice for inductor 120, and no discrete inductor 120 need be provided.

In order to facilitate connection of busbars to circuit carriers, including PC boards, as well as to ribbon wire, busbars of the panel are typically fabricated from tinned-copper ribbon wire; in many but not all embodiments the ribbon used for busbars is a wider, and thus lower-resistance, ribbon wire than the ribbon wire used to couple individual photovoltaic units in series. In a particular embodiment, two-millimeter wide ribbon wire is used for stringing photovoltaic units of a section in series, and five-millimeter wide ribbon is used for busbars.

In an alternative embodiment, as illustrated in FIG. 3, outputs of DC-DC converters 104 are coupled in series-parallel configuration. In embodiments resembling that of FIG. 3 and having complete DC-DC converters with internal inductors, such as inductors 166, 222, no additional inductors are necessary in the panel. In embodiments resembling that of FIG. 3 and having incomplete DC-DC converters 104c lacking internal inductors as illustrated in FIG. 8, a separate string inductor 230 is provided for each series string or group of DC-DC converters in the panel. A panel output capacitor 232 may also be provided to filter output current.

In an alternative embodiment, as illustrated in FIG. 4, the DC-DC converters are connected in parallel to drive the panel output. This embodiment is particularly useful with multicell PV device units 102, where it may be of use with either buck or boost converters, or with single-cell PV device units and boost-type converters.

In embodiments having incomplete, inductorless, buck-type DC-DC converters 104c as illustrated in FIG. 8, it can be desirable to coordinate switching of the converters in the sections. For example, if too few switching devices 184 are closed the output voltage of the panel may be insufficient to forward bias a blocking diode between the panel 100 and a battery load. On the other hand, if switching devices 184 of a sufficiently large number of sections are closed simultaneously, current flow will begin to build up in inductor 120 even if there is a blocking diode between the panel and a battery. In order to permit coordination of the DC-DC converters 104, a capacitively-isolated communications port 187 may be provided on each DC-DC converter 104 with the isolation capacitor 185; the communications ports 187 may be coupled to a master converter of converters 104, or to a panel microcontroller, operating a panel-wide synchronization and control algorithm.

Communications ports 187 in some alternative embodiments are bidirectional, and provide for transmitting control information to, and reading telemetry information from, individual sections. In an embodiment having boost converters coupled in parallel as illustrated in FIG. 4, where each converter is complete with inductor and coordinated switching is not necessary, the control information may include a desired panel output voltage such that the DC-DC converters may act as controllable output voltage regulators. In embodiments, telemetry information from each converter may include one or more of determined maximum power point current and voltage, converter input and output voltages and currents, and duty cycles of PWM-controlled switches.

In a particular embodiment, communications ports 187 are coupled to a single, panel-wide, interconnect for serial communications between the master converter or panel microcontroller and the DC-DC converters 104, where the controller 180 of each DC-DC converter must recognize its own address in a panel. In an alternative embodiment, each DC-DC converter 104c has a communications interconnect output 189 that is coupled to the next converter in a chain of converters in daisy-chain manner. In this embodiment, controllers 180 of DC-DC converters 104c may recognize commands according to their position in the chain without having to recognize discrete addresses.

Panels having converters of the complete, inductor-included, type illustrated in FIGS. 5, 6, and 7 may also benefit from having capacitively isolated communications ports 187, of either the daisy-chained, or panel-wide types. In a particular embodiment, converters 104 are not only controlled by the master converter or panel microcontroller, but may return telemetry information, such as voltage measurements at input and output terminals of the converters 104 and temperature measurements, to the master converter or microcontroller. In an embodiment, the panel microcontroller can format voltage, current, and temperature information received from the converters 104 and provide that voltage, current, and temperature telemetry information through a serial connector to a controller or computer outside the panel. Such telemetry information is of use in panel and system testing and monitoring. For example, should a PV device 102 fail, that information may be of interest to a system operator who could then determine whether the resulting degradation in system performance warrants panel replacement. In an alternative embodiment, the telemetry information is provided by serial wireless communication, and in a particular embodiment the telemetry information is provided by a radio transmitter corresponding to the IEEE 802.15.4-2003 standard using the ZigBee (™ ZigBee Alliance) protocol.

In alternative embodiments, converters of other than the buck-converter type may be used. In one such embodiment, boost converters are used for DC-DC converter devices 104, in another, buck-boost converters, and in another Cuk converters. It should be noted that buck, boost, and buck-boost converters typically have an actively-controlled switching device, such as device 164, and a freewheel device, such as device 162. Both isolated and non isolated topologies and their equivalents could be used.

In the embodiments discussed with reference to FIG. 5 and FIG. 8, interconnect coupling the converter devices 104 electrically in series is provided within the panel 100. Further, the DC-DC converter devices 104 have maximumpower-point-tracking (MPPT) circuitry 190 for adjusting operation of controller 160, 180 to optimize power transfer from PV portions of sections 106, 107, 111 and etc. to the DC-DC converter devices 104.

In an embodiment, the DC-DC converter devices 104 are formed from an integrated circuit 198 incorporating first active devices 164, 184, second active devices 162, 182, MPPT circuitry 190, and controller 160, 180. In a particular embodiment, the isolation capacitor 185 is integrated inside the integrated circuit 198. Integrated circuit 198 is assembled to an electric circuit carrier, such as a printed circuit board (PCB) 200 (FIG. 9) together with input capacitors 108, PCB 200 having an output bonding area 202 coupled to output node 170, 186, a second bonding area 204 coupled to first node 181, 161, and a third bonding area 206 for coupling to second node 183, 163. In an alternative embodiment, inductor 166 and output capacitor 168 are also attached to PCB 200. In yet another alternative embodiment, the electric circuit carrier is an integrated circuit package having at least three connections, one corresponding to each bonding area of PCB 200.

Figure 11:
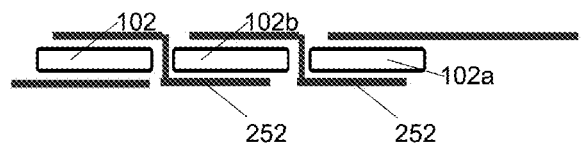
FIG. 11 is a cross-sectional illustration of ribbon wire attached to PV cells.
Figure 10:
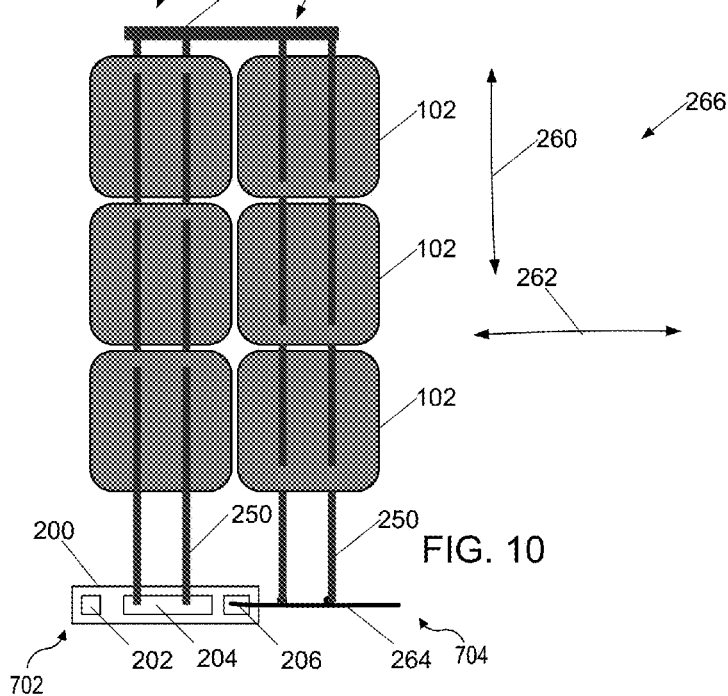
FIG. 10 is an illustration of PV cells and PCB of a section attached to ribbon wire.

In a particular embodiment of the panel of FIG. 1, PV cell units 102 are electrically coupled together in each section 106 by ribbon wire 250 to form a photovoltaic portion soldered to each unit 102, as illustrated in FIGS. 10 and 11. Ribbon wire is typically a metal conductive wire having a rectangular cross section, with wide sides attached to each unit. In the embodiment of FIGS. 10 and 11, each PV cell unit 102 has a first terminal on a first or top side of the unit 102, and a second terminal on a second or bottom side of the unit 102. In this embodiment, the units 102 are strung electrically in series by soldering sections of ribbon wire 252 to the first or top terminal of one unit 102b and the second or bottom terminal of an adjacent unit 102a. Typically, a first string 256 and a second string 258 of units 102 are coupled together by sections of ribbon wire 250 oriented parallel to a first axis 260, the two strings 256, 258 being coupled together in series by a busbar 254 of ribbon wire oriented parallel to a second axis 262 perpendicular to the first axis 260. Thus, as shown in FIG. 10, each string 256, 258 forms a respective column with busbar 254 electrically coupling end PV cell units 102 of each column. In the embodiment illustrated in FIG. 10, the ribbon wires 252 are paired to reduce impedance of these wires.

In a particular embodiment, as illustrated in FIG. 10, ribbon wires interconnecting the units 102 are paired in parallel and units 102 have metallization patterns adapted for use with two paralleled ribbon wires for each of the positive and negative terminals of the unit. In alternative embodiments, different numbers of ribbon wires may be used with units having metallization patterns adapted for use with the number of wires provided. In an alternative embodiment, having units, such as integrated multicell units, with integral connections between back-contact metallization and metal on a front surface of the unit, short ribbon shunts are used between the PV cell units.

Figure 9:
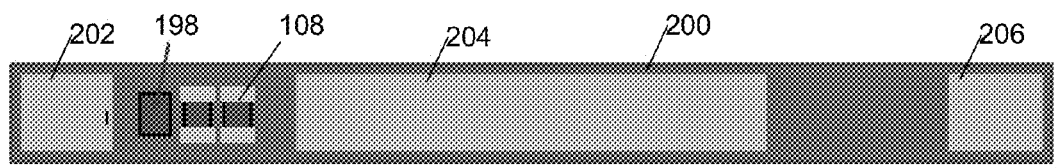
FIG. 9 illustrates a plan view of a printed circuit board (PCB) embodying an MPPT controller and DC-DC converter circuit.

In the embodiment of FIGS. 10 and 11, a PCB such as PCB 200 of FIG. 9 having a DC-DC converter 104 has second bonding area 204 bonded to ribbon wires 250 of a first end of a string 256 of PV cell units, and third bonding area 206 bonded to a busbar 264 of ribbon wire oriented parallel to the second axis 262 and in turn bonded to an end of second string 258 of units 102. Units 102 are thereby coupled in series, and to the second 204 and third 206 bonding areas of PCB 200 to form a section 266. In certain embodiments, DC-DC converter negative and positive output port nodes extend to opposing corners 702, 704 of section 266, as shown in FIG. 10. In these embodiments, busbar 264 is adapted to extend one of the output nodes to corner 704, as shown. In many embodiments, sections 266 are disposed such that corner 702 of one section 266 is adjacent to corner 704 of another section 266, thereby helping to minimize length of conductors coupling sections 266 in series.

Sections similar to that illustrated in FIG. 10 can be characterized as having PCB 200 at an edge of a rectangular region occupied by the section, and with busbar 258 at an opposite edge of the rectangular region. When these sections are organized as illustrated in FIG. 1, with the edge of the rectangular section regions having PCB 200 to the outside of the panel, with busbars 258 to the center of the panel, lines along the PCB 200's (or along DC-DC converters 104, 105) describe a U-shape together with a busbar connecting the bottommost two sections, such as section 111 and panel output connections made at the top of the U. When sections are organized in this U-shape manner, with PCB 200 to the outsides of the U, busbars 258 of two laterally-adjacent sections may be positioned adjacent to each other, or, in an alternative embodiment, the busbars 258 may be stacked vertically with one busbar atop the other but with the two busbars isolated from each other with an insulating tape. In an alternative embodiment, the busbars are covered with insulating tape and folded under the cells to minimize the space interruption in the middle of the panel.

Figure 13:
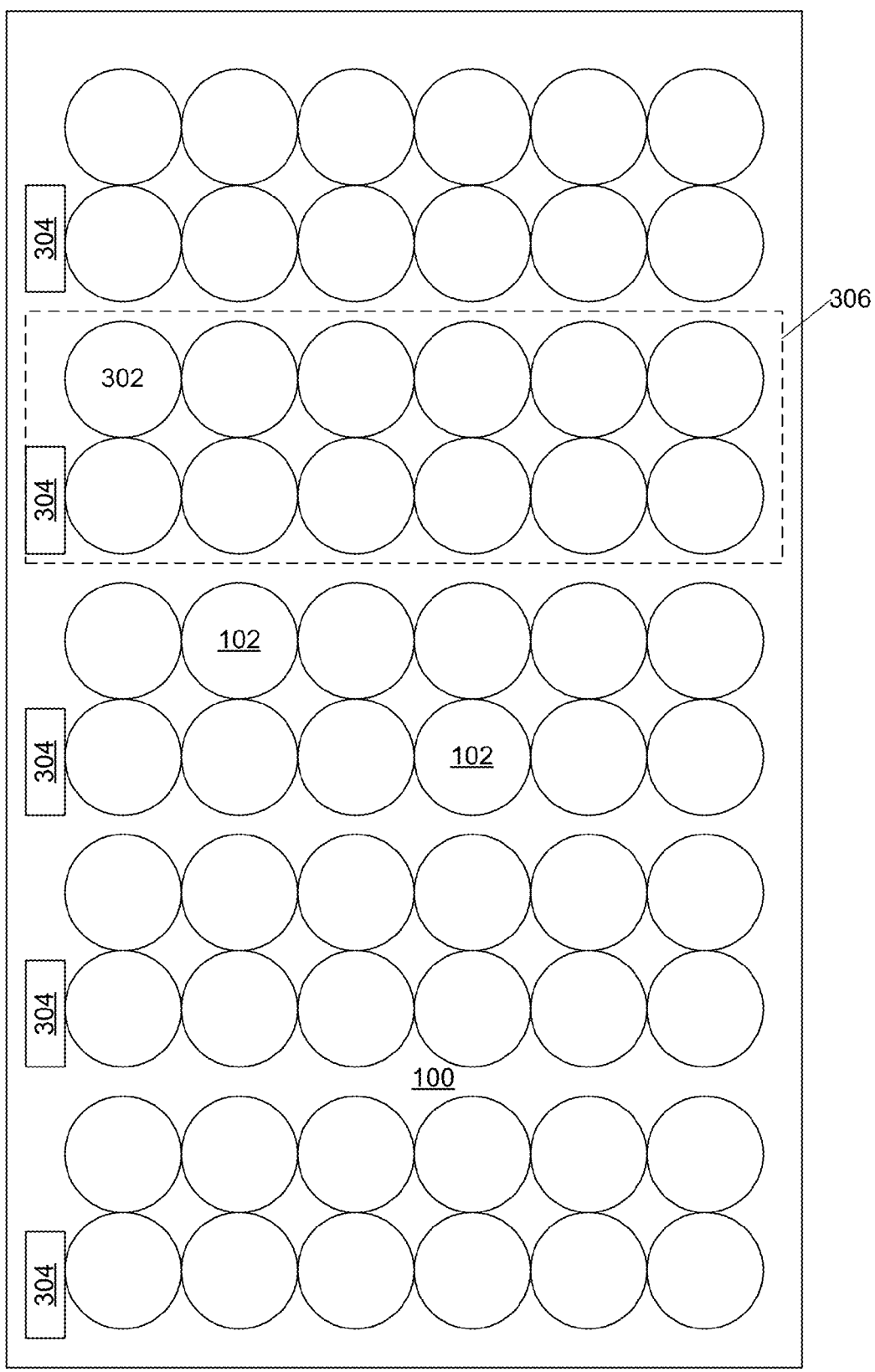
FIG. 13 is an illustration of an alternative arrangement of PV cells divided into sections with MPPT control devices.

While three units 102 are illustrated in each string 256, 258 of section 266, thus providing six units 102 in series, in various embodiments sections 266 may have other numbers of units in series to form photovoltaic portions; in the embodiment illustrated in FIG. 13, each section 306 has twelve PV cell units 302 in series and coupled to one PCB 304, each PCB 304 having one DC-DC converter with MPPT controller. In an embodiment, the DC-DC converters of PCBs 304 are coupled together electrically in series.

Figure 14:
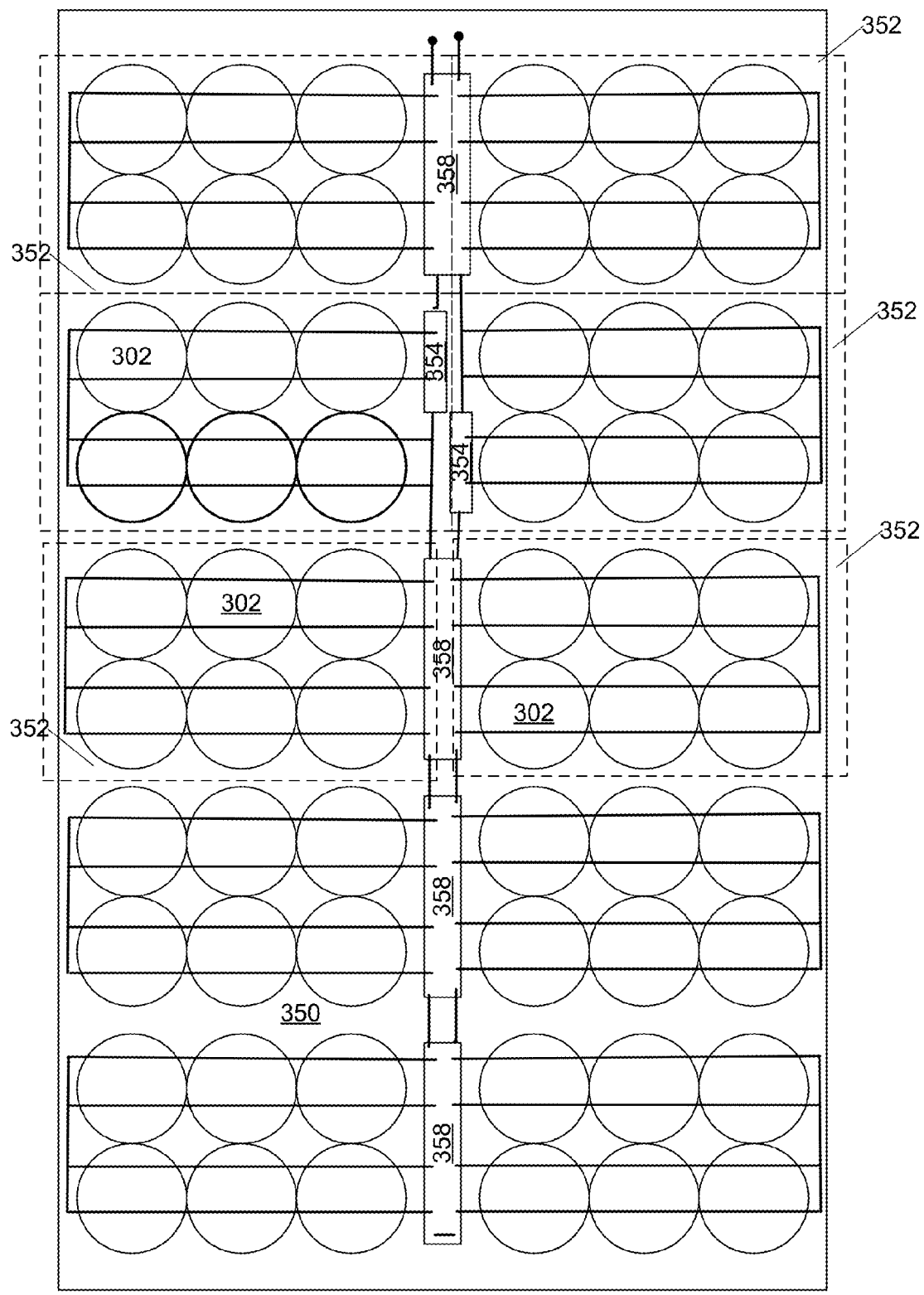
FIG. 14 is an illustration of an additional alternative arrangement of PV cells divided into sections with MPPT control devices, the MPPT devices arranged in a strip between sections.

An alternative embodiment, as illustrated in FIG. 14, of a panel 350 has sections 352 each with a number of PV cell units 302 coupled in series to form a photovoltaic portion within the section. The PV units 302 of each section are coupled to a PCB, which may be a per-section PCB 354 each having a single DC-DC converter and as illustrated in FIG. 9, or may be a PCB 358 for each section pair having a DC-DC converter for each of two sections, or a combination thereof. The PCBs 354, 358 are aligned along or near a central axis of panel 350 such that one section 352 coupled to section-pair PCBs 358 lies on each side of PCB 358. Thus, each section-pair PCB 358 is shared by two respective sections 352 disposed in a common row of two different columns of sections 352, as shown in FIG. 14. Similarly, where per-section PCBs 354 are used, the sections are positioned such that section edges with PCBs are adjacent. In various embodiments, the DC-DC converters of PCBs of the embodiment of FIG. 14 may be coupled together in series as shown in FIG. 14, may be coupled in series-parallel configuration, or may be coupled in parallel as illustrated in FIG. 4.

Figure 15:
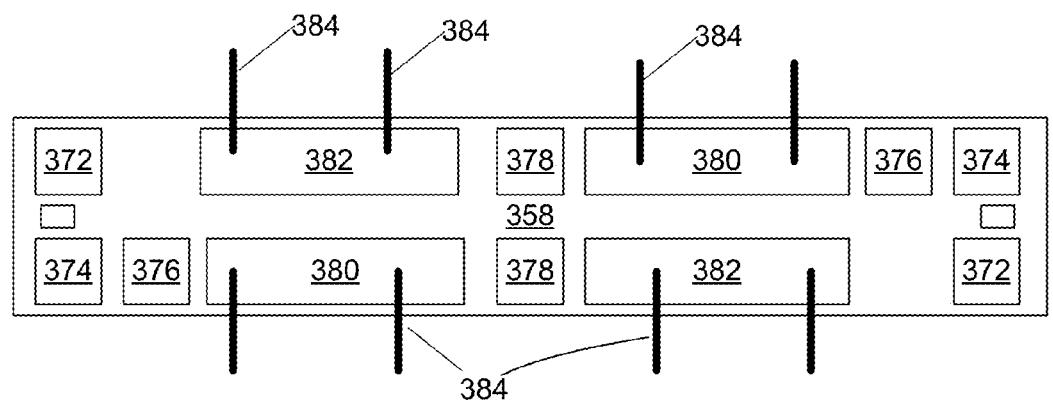
FIG. 15 is an illustration of an alternative embodiment of a PCB having DC-DC converters and input capacitors for two adjacent sections of PV cells.

FIG. 15 illustrates a PCB 358 such as may be used in each section pair of the embodiment illustrated in FIG. 14. In this embodiment, the PCB has negative attachment pads 372 and positive attachment pads 374 permitting connection of ribbon-wire bussing and panel output wiring to outputs of the DC-DC converters 376. The board has input capacitors 378 coupled between input terminals 380, 382 that couple through ribbon wire 384 to PV cell units of the section. In embodiments, input terminals 380, 382 may have lowered impedance through extra thicknesses of copper deposited by additive electroplating, or by soldering ribbon wire along the terminals.

Embodiments may have different wiring schemes within each section than that illustrated in FIG. 10. For example, a section, as illustrated in FIG. 16, having four or more (six in illustration) single-cell PV units 402, 404 coupled together in series with ribbon wires 406, 408 may have one or more units 404 with top interconnect and attached ribbon wires 408 rotated with respect to bottom interconnect and attached ribbon wires to permit lower resistance interconnection by reducing total length of ribbon wires.

Figure 16:
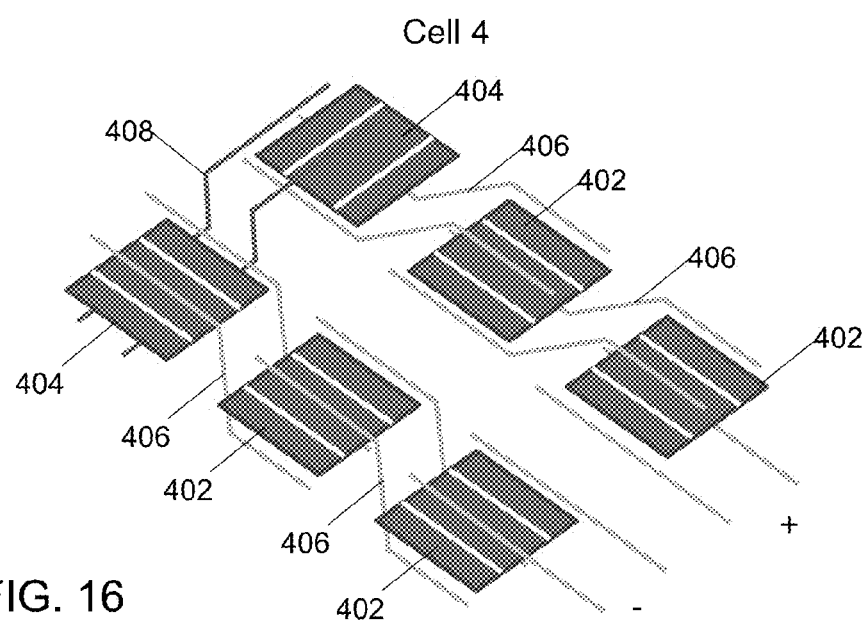
FIG. 16 is an illustration of an alternative embodiment of a layout of single-cell PV units and ribbon wire in a section.
Figure 17:
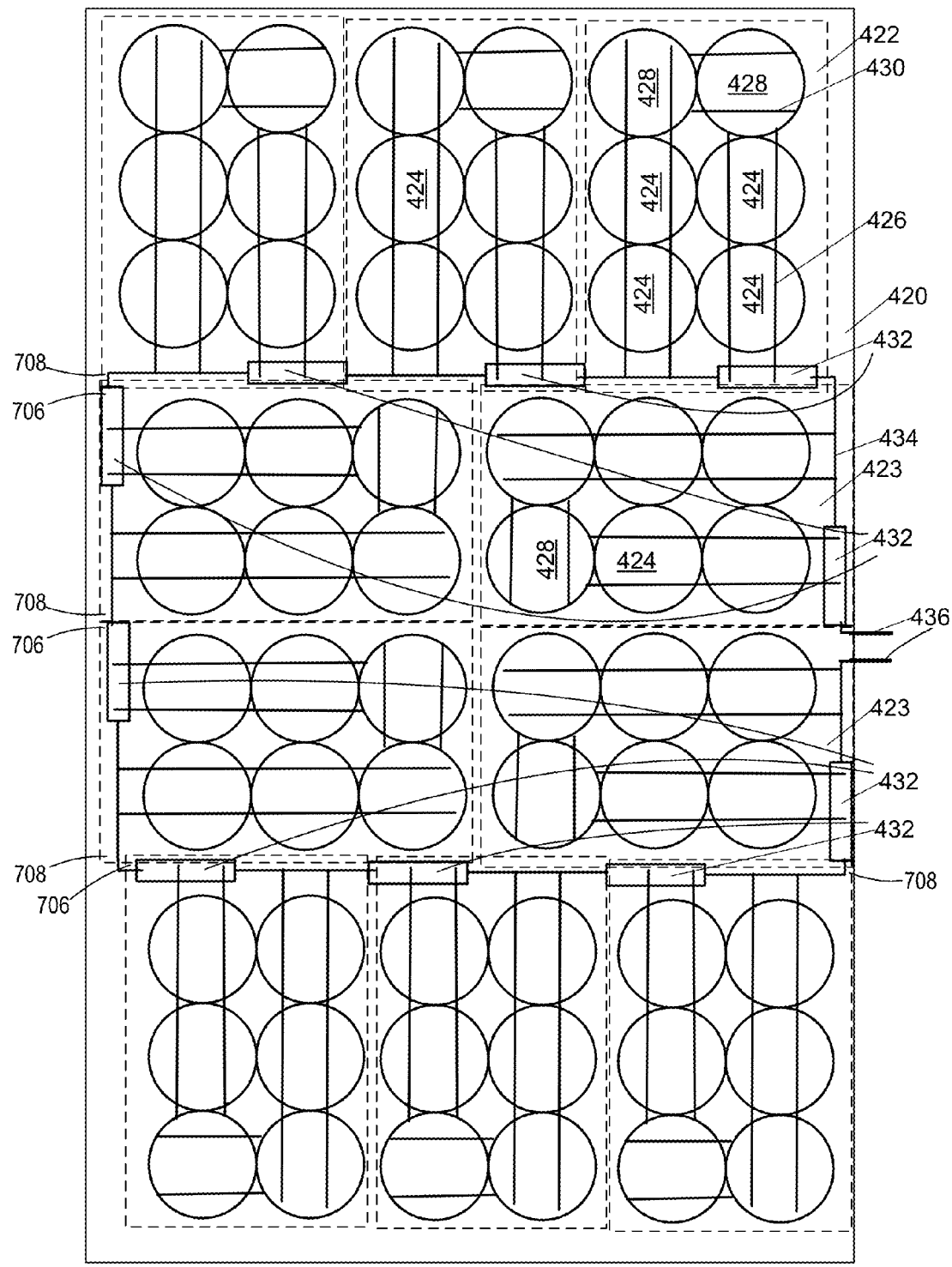
FIG. 17 is an illustration of another alternative arrangement of PV cells divided into sections with MPPT control devices, the MPPT devices arranged in a square pattern between sections.

An embodiment of a panel 420 (FIG. 17) has sections, such as sections 422, 423 resembling that of FIG. 16. These sections have some PV units 424 attached to parallel top and bottom ribbon wires 426, and some PV units 428 attached to top ribbon wires perpendicular to bottom ribbon wires, such as ribbon wires 426, 430. Each section has a DC-DC converter on a circuit carrier 432, the DC-DC converters having inputs from the PV units 424, 428, and outputs wired in series by busbars 434 and connected to panel terminals 436. In the embodiment illustrated in FIG. 17, the busbars 434, circuit carriers 432, ribbon wires 426, and PV units 424, 428 are all sealed to a transparent substrate as illustrated and discussed with reference to FIG. 12. The particular embodiment illustrated in FIG. 17 has the busbars 434 and circuit carriers 432 organized in a square or nearly square pattern, with the PV units of four sections within the square or nearly square pattern, and the PV units of six sections outside the square or nearly square pattern. This embodiment offers reduced busbar length and hence potentially less busbar resistance than the embodiment illustrated in FIG. 1. In a manner similar to that discussed above with respect to FIG. 10, each section 422, 423 has a rectangular shape with opposing corners 706, 708. Only some corners 706, 708 are labeled in FIG. 17 to promote illustrative clarity. The negative and positive output nodes of each section's DC-DC converter output port extend to corners 706, 708, respectively. In some alternate embodiments, the output node polarity at corners 706, 708 is reversed, such that the positive output node extends to corner 706, and the negative output node extends to corner 708. As shown in FIG. 17, each first corner 706 is adjacent to a second corner 708.

Figure 18:
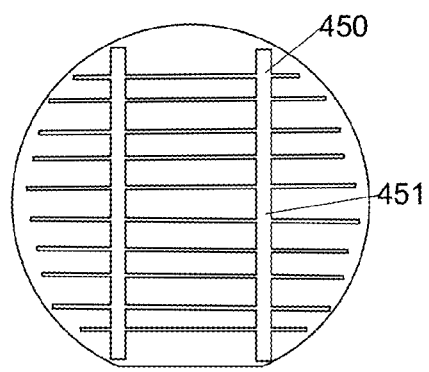
FIG. 18 illustrates a metallization pattern for use on a top layer of a round PV cell.

An embodiment of a section similar to that illustrated in FIG. 16 has PV cells with a uniform, unpatterned, bottom metal layer (not shown), and a top metal layer 450 patterned as illustrated in FIG. 18 with busbars 451 adapted for soldering to ribbon wire oriented in a first axis. An alternative embodiment of a section similar to that illustrated in FIG. 16 has one or more cells, such as cell 404, having a top layer patterned as illustrated in FIG. 18 with a bottom metal layer 452 (FIG. 19) having busbars 454 or solderable areas adapted for soldering to ribbon wire oriented in a second axis perpendicular to the first axis and adapted for use as a corner cell 404 (FIG. 16). Another alternative embodiment of a section similar to that illustrated in FIG. 16 has one or more cells having a top layer patterned as illustrated in FIG. 18 with a bottom metal layer 456 having busbars (FIG. 20) or solderable areas adapted in a grid pattern to permit soldering the busbars to ribbon wire oriented in either the first axis or in a second axis perpendicular to the first axis, such cells are useful as corner cells 404 soldered to ribbon wire aligned along each of two axes, or as non-corner cells 402 in a section.

Figure 19:
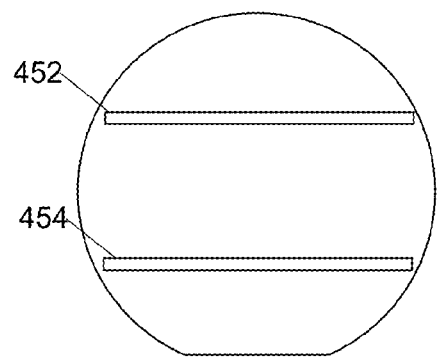
FIG. 19 illustrates a metallization pattern for use on a bottom layer of a round PV cell for mounting at a corner of a section of cells in a panel.
Figure 20:
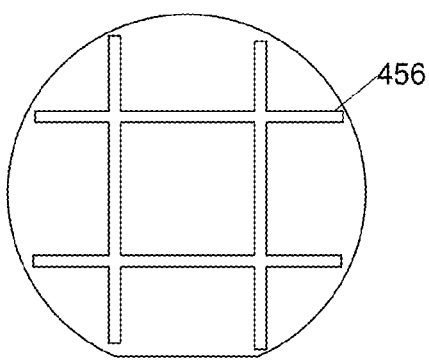
FIG. 20 illustrates a metallization pattern adaptable for use on a bottom layer of a round PV cell for mounting at any location in a section of cells in a panel.

While FIGS. 18-20 show a flatted round photovoltaic cell, these layouts are also adaptable to sections having square PV cells as illustrated in FIG. 16.

Figure 12:
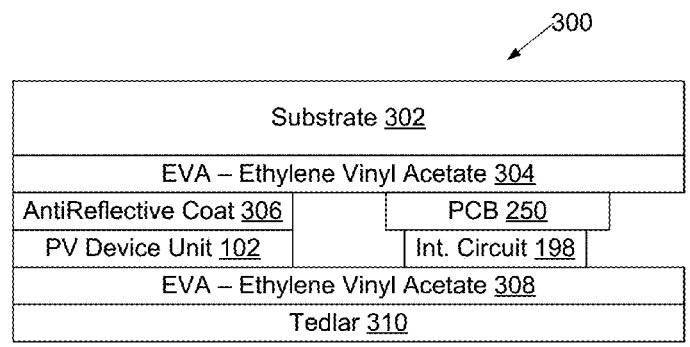
FIG. 12 is an enlarged cross sectional diagram showing layers of the integrated panel.

To assemble the panel 300, strings 256, 258, and PCBs 200 of each section are preassembled. A sheet 304 (FIG. 12) of ethylene vinyl acetate (EVA) is placed on a transparent substrate 302. In particular embodiments, substrate 302 may be tempered, low-iron, glass; in other embodiments substrate 302 is a transparent polymeric material. EVA serves as a hot-melt adhesive and sealant in this panel. The EVA sheet 304 may be topped with antireflective coating sheet 306. In an embodiment, antireflective coating sheet 306 is made of one or more transparent materials having one or more indexes of refraction and thicknesses chosen to minimize reflections at the boundary of the PV units 102 and EVA 304. The series-connected PV cell units 102 and ribbon wires 252 of each section 106 as previously described are arranged on the EVA sheet with their optically-sensitive sides facing substrate 302, and the PCB in a desired position adjacent. If not already done, ribbon-wire busbars 264 are attached to the output bonding area of any adjacent section, such as section 107. Any other wiring within the bonded portion of the panel, such as leads that may later connect to a terminal box of the panel, is also attached. A second EVA sheet 308 is laid over the PV cell units 102, ribbon wires 252, and PCBs 200. A sheet 310 of polyvinyl fluoride, such as Tedlar™ (trademark of Du Pont), or other moisture-barrier sealing material, is then placed on top of the second EVA sheet 308. The panel is then suctioned to remove air between EVA sheet 304 and substrate 302 and from between PV cell units 102 and the EVA sheet 304, compressed, and heated in a suitable fixture to melt and cure the EVA sheets 304, 308, thereby forming a hermetic seal around PV cell units 102 and PCBs 200 with material of the first EVA sheet 304 adherent to the glass substrate 302, PCB 200, and PV device units 102, and with material of the second EVA sheet 308 adherent to the Tedlar sheet 310, and to the first EVA sheet 304, as well as to PCB 200, DC-DC converter integrated circuit 198, and PV device units 102. Thus, layers 304, 308, and 310 are laminating layers sealing PV cell units 102 and PCBs 200 to substrate 302, or encapsulating PV cell units 102 and PCBs 200 on substrate 302, as shown in FIG. 12.

In alternative embodiments, additional layers and materials may also be used within the panel, such as a handling layer that may ease assembly of the sections into the panel. It is also anticipated that alternative heat-curable or hot-melt adhesive materials may replace EVA as a bonding agent in the panel 300. In alternative embodiments, the EVA sheet 308 may be placed on polyvinyl fluoride sheet 310, the PV cell units 102, PCBs 200, and wiring added, followed by EVA sheet 304 and substrate 302; upon suctioning, compressing, and heating the layers a similar hermetic seal results in panel 300.

In an alternative embodiment, PCBs 200, 354, 358 such as are illustrated in FIG. 9 or 15, and shown between sections in FIG. 14 and at section edges in FIGS. 1, 13 may be placed behind a PV cell 102, and insulated from cell 102 by an insulating tape. Such embodiments will have extra thickness at the PCB location.

While a particular embodiment having six PV cell units 102 electrically coupled in series in each section 106, 107, with 10 sections organized in a U-pattern, it is anticipated that other embodiments may have different numbers of sections, and may have different numbers of PV cell units in each section, and may have a total number of PV cell units per panel differing from the sixty illustrated in FIG. 1. For example, FIG. 13 illustrates twelve PV cell units in a section, with five sections per panel. Another embodiment having the same total number sixty of PV cell units may have twenty PV cell units in a section, with three sections per panel.

Additionally, it is anticipated that some other embodiments will include eight PV cell units per section, ten PV cell units per section, or twenty four PV cell units per section. Further, it is anticipated that the PV cell units 102 may be fabricated as round, half-round, square, square with lopped corners, rectangular, or any other shape that permits their assembly into a panel without excessive wasted area. With large PV cell units, such as may be fabricated on larger wafers, there may be fewer PV units per panel than shown.

Figure 21:
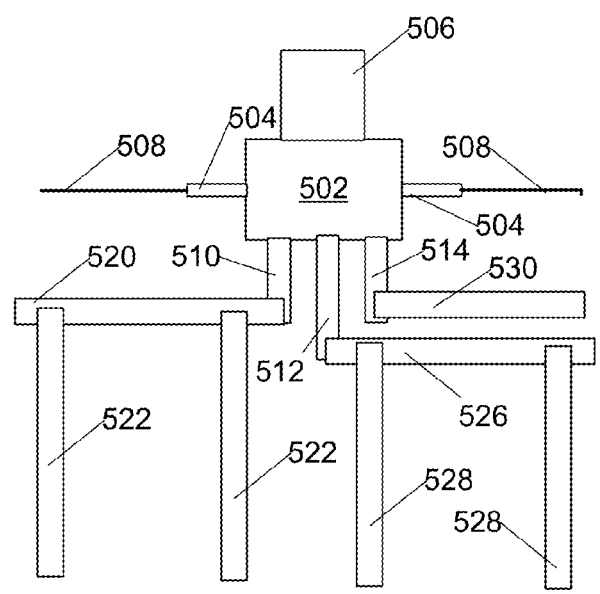
FIG. 21 illustrates an alternative embodiment having a modified integrated circuit package as a circuit carrier.

An alternative embodiment of the panel has DC-DC converters implemented within a modified integrated circuit package 502 (FIG. 21) embedded directly into the panel as a circuit carrier without a PCB. In this embodiment, package 502 may have a cooling tab 506, and may have small-diameter pins 504 for series connection of a communications interconnect 508, which may be of small-diameter wire. In this embodiment, package 502 has three wide pins 510, 512, 514 corresponding to the three PCB terminals 202, 206, 204 of PCB-based versions. Wide pin 510 is spotwelded or soldered to ribbon wire bus 520 that is coupled to a terminal of PV unit string through ribbon wires 522 and to an input terminal of a following section. Wide pin 512 is spotwelded or soldered to ribbon wire bus 526 that is coupled to a second terminal of the PV unit string through ribbon wires 528. Wide pin 514 serves as a section input or common terminal, which is coupled through ribbon wire bus 530 to a terminal of the panel or to a wide pin 510 of a preceding section.

In operation, it is expected that panels of the present design will maintain more output capacity when a portion of the panel 100 is in shadow 109 as illustrated in FIG. 1. While photocurrent of the series-connected PV cell units 102 within the section 111 is limited by photocurrent of the most-shaded cell unit 112, the MPPT tracking circuitry 190 within that section will find an operating point for the section where maximum power is transferred to the DC-DC converter 105 of that section. DC-DC converter 105 will then provide the same output current as provided by DC-DC converters 104 of other sections of panel 100, but at a lower section voltage than provided by those other sections capable of developing higher wattage.

Combinations of Features

Features described above as well as those claimed below may be combined in various ways without departing from the scope hereof. The following examples illustrate some possible combinations:

(A1) An integrated photovoltaic panel may include a substrate and one or more sections. Each section may include (a) a DC-DC converter including an input port and an output port, and (b) a photovoltaic portion including one or more interconnected photovoltaic (PV) cell units electrically coupled to the input port of the DC-DC converter. The integrated photovoltaic panel may further include material sealing each PV cell unit and each DC-DC converter to the substrate.

(A2) In the integrated photovoltaic panel denoted as (A1), the one or more sections may include a plurality of sections.

(A3) In the integrated photovoltaic panel denoted as (A2), output ports of the DC-DC converters of at least two of the plurality of sections may be electrically coupled in series.

(A4) Either of the integrated photovoltaic panels denoted as (A2) or (A3) may further include an energy storage inductor electrically coupled in series with the output port of the DC-DC converter of at least one of the plurality of sections.

(A5) In either of the integrated photovoltaic panels denoted as (A2) or (A3), parasitic inductance of panel interconnect may serve as an energy storage inductor coupled in series with the output port of the DC-DC converter of at least one of the plurality of sections.

(A6) In either of the integrated photovoltaic panels denoted as (A2) or (A3), output ports of the DC-DC converters of at least two of the plurality of sections may be electrically coupled in parallel.

(A7) In the integrated photovoltaic panel denoted as (A2): (a) output ports of the DC-DC converters of a first subset of the plurality of sections may be electrically coupled in series to form a first group of sections; (b) output ports of the DC-DC converters of a second subset of the plurality of sections may be electrically coupled in series to form a second group of sections; and (c) each of the first and second groups of sections may include at least two sections, where each section of the first group of sections is different from each section of the second group of sections.

(A8) In the integrated photovoltaic panel denoted as (A7), the first group of sections may be electrically coupled in parallel with the second group of sections.

(A9) Either of the integrated photovoltaic panels denoted as (A7) or (A8) may further include: (a) a first energy storage inductor electrically coupled in series with the first group of sections; and (b) a second energy storage inductor electrically coupled in series with the second group of sections.

(A10) In any of the integrated photovoltaic panels denoted as (A2) through (A9), the plurality of sections may be disposed in a single column.

(A11) In any of the integrated photovoltaic panels denoted as (A2) through (A9), a first subset of the plurality of sections may be disposed in a first column, and a second subset of the plurality of sections may be disposed in a second column, where the second column is different from the first column.

(A12) In the integrated photovoltaic panel denoted as (A11), the plurality of sections may include a first section in the first column and a second section in the second column, where: (a) the first and second sections are in a common row, (b) the DC-DC converter of the first section and the DC-DC converter of the second section are part of a common assembly.

(A13) In the integrated photovoltaic panel denoted as (A12), the DC-DC converter of the first section and the DC-DC converter of the second section may share a common circuit board.

(A14) In the integrated photovoltaic panel denoted as (A2): (a) each one of the plurality of sections may have a rectangular shape with opposing first and second corners; and (b) in each one of the plurality of sections: (1) a positive output node of the output port of the section may extend to the first corner, and (2) a negative output node of the output port of the section may extend to the second corner.

(A15) In the integrated photovoltaic panel denoted as (A14), the plurality of sections may be disposed such that at least one first corner is adjacent to at least one second corner.

(A16) Either of the integrated photovoltaic panels denoted as (A14) or (A15) may further include a busbar adapted to: (a) extend the positive output node of one of the plurality of sections to the first corner of the section; and (b) connect the output port of the section to the output port of an adjacent one of the plurality of sections.

(A17) Either of the integrated photovoltaic panels denoted as (A14) or (A15) may further include a busbar adapted to: (a) extend the negative output node of one of the plurality of sections to the second corner of the section; and (b) connect the output port of the section to the output port of an adjacent one of the plurality of sections.

(A18) In any of the integrated photovoltaic panels denoted as (A14) through (A17), the plurality of sections may be disposed such that each first corner is adjacent to a respective second corner.

(A19) In any of the integrated photovoltaic panels denoted as (A14) through (A18), the plurality of sections may include at least three sections disposed such that some of the first corners are adjacent to two second corners.

(A20) In the integrated photovoltaic panel denoted as (A19), the plurality of sections may be disposed in two different columns such that at least one first corner is adjacent to a second corner in each of the two different columns.

(A21) In the integrated photovoltaic panel denoted as (A18), each one of the plurality of sections may have a first side bounded by the first and second corners of the section, wherein: (a) a first subset of the plurality are sections are disposed such that the first side of each section of the first subset is oriented according to a first axis; (b) a second subset of the plurality are sections are disposed such that the first side of each section of the second subset is oriented according to a second axis; (c) a third subset of the plurality are sections are disposed such that the first side of each section of the third subset is oriented according to a third axis; (d) a fourth subset of the plurality are sections are disposed such that the first side of each section of the fourth subset is oriented according to a fourth axis; (e) the first axis is parallel to but offset from the second axis; (f) the third axis is parallel to but offset from the fourth axis; and (g) the first and second axes are perpendicular to the third and fourth axes.

(A22) In any of the integrated photovoltaic panels denoted as (A2) through (A21), each DC-DC converter may include a respective converter assembly, and at least some of the plurality of sections may occupy a rectangular space upon the substrate such that converter assemblies of the DC-DC converters of the sections are adjacent a first side of the rectangular space.

(A23) In the integrated photovoltaic panel denoted as (A22), each converter assembly may include a circuit board.

(A24) In any of the integrated photovoltaic panels denoted as (A2) through (A23), each DC-DC converter may include first, second, and third terminals collectively forming the input and output ports of the DC-DC converter.

(A25) In the integrated photovoltaic panel denoted as (A24), the first and second terminals may be input terminals, and the first and third terminals may be output terminals.

(A26) In the integrated photovoltaic panel denoted as (A25), each DC-DC converter may be configured such that: (a) the first terminal of the DC-DC converter is a combined negative input terminal and negative output terminal; (b) the second terminal of the DC-DC converter is a positive input terminal; and (c) the third terminal of the DC-DC converter is a positive output terminal.

(A27) In the integrated photovoltaic panel denoted as (A25), each DC-DC converter may be configured such that: (a) the first terminal of the DC-DC converter is a combined positive input terminal and positive output terminal; (b) the second terminal of the DC-DC converter is a negative input terminal; and (c) the third terminal of the DC-DC converter is a negative output terminal.

(A28) In the integrated photovoltaic panel denoted as (A25), each DC-DC converter may be configured such that: (a) the first terminal of the DC-DC converter is a combined negative input terminal and positive output terminal; (b) the second terminal of the DC-DC converter is a positive input terminal; and (c) the third terminal of the DC-DC converter is a negative output terminal.

(A29) In any of the integrated photovoltaic panels denoted as (A25) through (A28), the plurality of sections may include first and second sections, and the first terminal of the DC-DC converter of the first section may be electrically coupled to the third terminal of the DC-DC converter of the second section.

(A30) The integrated photovoltaic panel denoted as (A29) may further include a first busbar connecting the first terminal of the DC-DC converter of the first section to the third terminal of the DC-DC converter of the second section.

(A31) In the integrated photovoltaic panel denoted as (A30), the first busbar may further connect the photovoltaic portion of the first section to the first terminal of the DC-DC converter of the first section.

(A32) In any of the integrated photovoltaic panels denoted as (A2) through (A31), the DC-DC converter of at least one of the plurality of sections may be adapted to communicate information via one or more interconnects.

(A33) In the integrated photovoltaic panel denoted as (A32), the one or more interconnects may communicatively couple DC-DC converters of at least two of the plurality of sections.

(A34) In the integrated photovoltaic panel denoted as (A32), the one or more interconnects may communicatively couple DC-DC converters of at least one of the plurality of sections to a master device.

(A35) In the integrated photovoltaic panel denoted as (A34), the master device may include a master DC-DC converter.

(A36) In the integrated photovoltaic panel denoted as (A34), the master device may include a panel microcontroller.

(A37) In any of the integrated photovoltaic panels denoted as (A32) through (A36), the one or more interconnects may be operable to communicatively coupling telemetry information.

(A38) In any of the integrated photovoltaic panels denoted as (A32) through (A37), the one or more interconnects may be operable to communicatively couple DC-DC converter control information.

(A39) In any of the integrated photovoltaic panels denoted as (A32) through (A38), the one or more interconnects may be operable to communicatively couple DC-DC converter synchronization information.

(A40) In any of the integrated photovoltaic panels denoted as (A32) through (A39), the one or more interconnects may be adapted to capacitively couple information.

(A41) In the integrated photovoltaic panel denoted as (A40), the one or more interconnects may include at least one capacitor integrated in the DC-DC converter of at least one of the plurality of sections.

(A42) In the integrated photovoltaic panel denoted as (A2), at least one of the plurality of sections may include busbars electrically coupling the photovoltaic portion of the section to the DC-DC converter of the section.

(A43) The integrated photovoltaic panel denoted as (A2) may further include at least one busbar electrically coupling output ports of DC-DC converters of at least two of the plurality of sections.

(A44) The integrated photovoltaic panel denoted as (A43) may further include a busbar electrically coupling the output ports of the DC-DC converter of first and second sections of the plurality of sections, and the busbar may further connect the photovoltaic portion of the first section to the input port of the DC-DC converter of the first section.

(A45) In any of the integrated photovoltaic panels denoted as (A2) through (A44), at least two of the plurality of sections may include the same number of photovoltaic cell units.

(A46) In any of the integrated photovoltaic panels denoted as (A2) through (A44), at least two of the plurality of sections may include a different number of photovoltaic cell units.

(A47) In any of the integrated photovoltaic panels denoted as (A1) through (A46), the DC-DC converter of at least one of the one or more sections may be adapted to perform maximum power point tracking on the photovoltaic portion of the respective section.

(A48) In any of the integrated photovoltaic panels denoted as (A1) through (A47), at least one photovoltaic portion may include: (a) a first photovoltaic cell unit having opposing top and bottom sides, where the first photovoltaic cell unit includes (1) a first solderable area on the top side, and (2) a second solderable area on the bottom side; (b) a first ribbon wire attached to the first solderable area, where the first solderable area and the first ribbon wire are oriented according to a first axis; and (c) a second ribbon wire attached to the second solderable area, where the second solderable area and the second ribbon wire are oriented according to a second axis, and the second axis being different from the first axis.

(A49) In the integrated photovoltaic panel denoted as (A48), the first photovoltaic cell unit may further include a third solderable area on the bottom side of the first photovoltaic unit cell, where the third solderable area is oriented according to the first axis.

(A50) In either of the integrated photovoltaic panels denoted as (A48) or (A49), the first axis may be perpendicular to the second axis.

(A51) In any of the integrated photovoltaic panels denoted as (A1) through (A50), the photovoltaic unit cells of at least one photovoltaic portion may be electrically coupled in series.

(A52) In the integrated photovoltaic panel denoted as (A51), the photovoltaic unit cells of at least one photovoltaic portion may be electrically coupled in series by ribbon wire.

(A53) In any of the integrated photovoltaic panels denoted as (A1) through (A52), at least one photovoltaic portion may include: (a) first and second columns of photovoltaic cell units, where each of the columns includes one or more photovoltaic cell units electrically coupled in series; and (b) one or more electrical conductors electrically coupling an end photovoltaic cell unit of the first column to an end photovoltaic cell unit of the second column.

(A54) In the integrated photovoltaic panel denoted as (A1), the DC-DC converter of at least one of the one or more sections may include: (a) a switching device electrically coupled between the input and output ports of the DC-DC converter; and (b) a freewheel device electrically coupled across the output port of the DC-DC converter.

(A55) In the integrated photovoltaic panel denoted as (A1), the DC-DC converter of at least one of the one or more sections may include: (a) a switching device and an energy storage inductor electrically coupled in series between the input and output ports of the DC-DC converter; and (b) a freewheel device electrically coupled between the output port and the energy storage inductor of the DC-DC converter.

(A56) In the integrated photovoltaic panel denoted as (A55), the DC-DC converter of at least one of the one or more sections may further include an output capacitor electrically coupled across the output port of the DC-DC converter.

(A57) In any of the integrated photovoltaic panels denoted as (A1) through (A56), the photovoltaic portion of at least one of the one or more sections may include six photovoltaic cell units, eight photovoltaic cell units, ten photovoltaic cell units, twelve photovoltaic cell units, twenty photovoltaic cell units, or twenty four photovoltaic cell units.

(A58) In any of the integrated photovoltaic panels denoted as (A1) through (A57), the substrate may be formed of glass or a transparent polymeric material.

(A59) In any of the integrated photovoltaic panels denoted as (A1) through (A58), the material sealing each PV cell unit and each DC-DC converter to the substrate may include laminating material.

(A60) In the integrated photovoltaic panel denoted as (A59), the laminating material may include one or more layers of ethylene vinyl acetate.

(A61) Any of the integrated photovoltaic panels denoted as (A1) through (A60) may further include a back barrier layer disposed on the material sealing each PV cell unit and each DC-DC converter to the substrate, such that each PV cell unit and each DC-DC converter are disposed between the back barrier layer and the substrate.

(A62) In the integrated photovoltaic panel of claim 61, the back barrier layer may include polyvinyl fluoride.

(B1) A photovoltaic cell unit may include: a first solderable area on a top side of the photovoltaic cell unit and a second solderable area on a bottom side of the photovoltaic cell unit, where the bottom side is opposite of the top side. The first solderable area may be oriented according to a first axis, and the second solderable area may be oriented according to a second axis, where the second axis is different from the first axis.

(B2) In the photovoltaic assembly denoted as (B1), the photovoltaic cell unit may further include a third solderable area on the bottom side and oriented according to the first axis.

(B3) In either the photovoltaic assemblies denoted as (B1) or (B2), the first axis may be perpendicular to the second axis.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall there between.

What is claimed is:
1. An integrated photovoltaic panel, comprising:
a substrate;
a plurality of sections disposed on the substrate, each of the plurality of sections including:
a respective electric circuit carrier,
a respective DC-DC converter including (a) a switching device, a freewheeling device, and a control unit disposed on the electric circuit carrier of the section, an (b) input port, and (c) an output port, and
a respective photovoltaic portion including one or more interconnected photovoltaic (PV) cell units electrically coupled to the input port of the DC-DC converter of the section;

a shared bus bar having opposing first and second ends, the first end of the shared bus bar being physically and electrically connected to a bonding area of the electric circuit carrier of a first section of the plurality of sections such that the first end is electrically coupled to the input port of the DC-DC converter of the first section, the second end of the shared bus bar being physically and electrically coupled to a bonding area of the electric circuit carrier of a second section of the plurality of sections such that the second end is electrically coupled to the output port of the DC-DC converter of the second section, and a portion of the shared bus bar between the first and second ends of the shared bus bar being physically and electrically connected to the photovoltaic portion of the first section of the plurality sections; and material sealing each PV cell unit and each DC-DC converter to the substrate;

wherein:

output ports of the DC-DC converters of a first subset of the plurality of sections are electrically coupled in series to form a first group of sections, output ports of the DC-DC converters of a second subset of the plurality of sections are electrically coupled in series to form a second group of sections, each of the first and second groups of sections includes at least two sections, each section of the first group of sections is different from each section of the second group of sections, the first group of sections is electrically coupled in parallel with the second group of sections, and the integrated photovoltaic panel further comprises a first enemy storage inductor electrically coupled in series with the first group of sections and a second energy storage inductor electrically coupled in series with the second group of sections.

2. The integrated photovoltaic panel of claim 1, output ports of the DC-DC converters of at least two of the plurality of sections being electrically coupled in series.

3. The integrated photovoltaic panel of claim 1, further comprising an energy storage inductor electrically coupled in series with the output port of the DC-DC converter of at least one of the plurality of sections.

4. The integrated photovoltaic panel of claim 1, wherein parasitic inductance of panel interconnect serves as an energy storage inductor coupled in series with the output port of the DC-DC converter of at least one of the plurality of sections.

5. The integrated photovoltaic panel of claim 1, output ports of the DC-DC converters of at least two of the plurality of sections being electrically coupled in parallel.

6. The integrated photovoltaic panel of claim 1, the plurality of sections being disposed in a single column.

7. The integrated photovoltaic panel of claim 1, a first subset of the plurality of sections being disposed in a first column, a second subset of the plurality of sections being disposed in a second column, the second column being different from the first column.

8. The integrated photovoltaic panel of claim 7, the plurality of sections comprising a third section in the first column and a fourth section in the second column, the third and fourth sections being in a common row, the DC-DC converter of the third section and the DC-DC converter of the fourth section being part of a common assembly.

9. The integrated photovoltaic panel of claim 8, the DC-DC converter of the third section and the DC-DC converter of the fourth section sharing a common circuit board.

10. The integrated photovoltaic panel of claim 1, wherein:

each one of the plurality of sections has a rectangular shape with opposing first and second corners; and in each one of the plurality of sections:

a positive output node of the output port of the section extends to the first corner, and a negative output node of the output port of the section extends to the second corner.

11. The integrated photovoltaic panel of claim 10, the plurality of sections being disposed such that at least one first corner is adjacent to at least one second corner.

12. The integrated photovoltaic panel of claim 11, further comprising a busbar adapted to:

extend the positive output node of one of the plurality of sections to the first corner of the section; and connect the output port of the section to the output port of an adjacent one of the plurality of sections.

13. The integrated photovoltaic panel of claim 11, further comprising a busbar adapted to:

extend the negative output node of one of the plurality of sections to the second corner of the section; and connect the output port of the section to the output port of an adjacent one of the plurality of sections.

14. The integrated photovoltaic panel of claim 10, the plurality of sections being disposed such that each first corner is adjacent to a respective second corner.

15. The integrated photovoltaic panel of claim 14, the plurality of sections comprising at least three sections disposed such that some of the first corners are adjacent to two second corners.

16. The integrated photovoltaic panel of claim 15, the plurality of sections being disposed in two different columns such that at least one first corner is adjacent to a second corner in each of the two different columns.

17. The integrated photovoltaic panel of claim 14, each one of the plurality of sections having a first side bounded by the first and second corners of the section, wherein:

a first subset of the plurality are sections are disposed such that the first side of each section of the first subset is oriented according to a first axis;

a second subset of the plurality are sections are disposed such that the first side of each section of the second subset is oriented according to a second axis;

a third subset of the plurality are sections are disposed such that the first side of each section of the third subset is oriented according to a third axis;

a fourth subset of the plurality are sections are disposed such that the first side of each section of the fourth subset is oriented according to a fourth axis;

the first axis is parallel to but offset from the second axis;

the third axis is parallel to but offset from the fourth axis; and the first and second axes are perpendicular to the third and fourth axes.

18. The integrated photovoltaic panel of claim 1, each DC-DC converter comprising a respective converter assembly, at least some of the plurality of sections occupying a rectangular space upon the substrate such that converter assemblies of the DC-DC converters of the sections are adjacent a first side of the rectangular space.

19. The integrated photovoltaic panel of claim 1, each DC-DC converter comprising first, second, and third terminals collectively forming the input and output ports of the DC-DC converter.

20. The integrated photovoltaic panel of claim 19, the first and second terminals being input terminals, and the first and third terminals being output terminals.

21. The integrated photovoltaic panel of claim 20, wherein each DC-DC converter is configured such that:
the first terminal of the DC-DC converter is a combined negative input terminal and negative output terminal;
the second terminal of the DC-DC converter is a positive input terminal; and
the third terminal of the DC-DC converter is a positive output terminal.

22. The integrated photovoltaic panel of claim 20, wherein each DC-DC converter is configured such that:
the first terminal of the DC-DC converter is a combined positive input terminal and positive output terminal;
the second terminal of the DC-DC converter is a negative input terminal; and
the third terminal of the DC-DC converter is a negative output terminal.

23. The integrated photovoltaic panel of claim 20, wherein each DC-DC converter is configured such that:
the first terminal of the DC-DC converter is a combined negative input terminal and positive output terminal;
the second terminal of the DC-DC converter is a positive input terminal; and
the third terminal of the DC-DC converter is a negative output terminal.

24. The integrated photovoltaic panel of claim 20, the first terminal of the DC-DC converter of the first section being electrically coupled to the third terminal of the DC-DC converter of the second section.

25. The integrated photovoltaic panel of claim 1, the DC-DC converter of at least one of the plurality of sections adapted to communicate information via one or more interconnects.

26. The integrated photovoltaic panel of claim 25, the one or more interconnects communicatively coupling DC-DC converters of at least two of the plurality of sections.

27. The integrated photovoltaic panel of claim 25, the one or more interconnects communicatively coupling DC-DC converters of at least one of the plurality of sections to a master device.

28. The integrated photovoltaic panel of claim 27, the master device comprising a master DC-DC converter.

29. The integrated photovoltaic panel of claim 27, the master device comprising a panel microcontroller.

30. The integrated photovoltaic panel of claim 25, the one or more interconnects operable to communicatively couple telemetry information.

31. The integrated photovoltaic panel of claim 25, the one or more interconnects operable to communicatively couple DC-DC converter control information.

32. The integrated photovoltaic panel of claim 31, the one or more interconnects operable to communicatively couple DC-DC converter synchronization information.

33. The integrated photovoltaic panel of claim 25, the one or more interconnects adapted to capacitively couple information.

34. The integrated photovoltaic panel of claim 33, the one or more interconnects comprising at least one capacitor integrated in the DC-DC converter of at least one of the plurality of sections.

35. The integrated photovoltaic panel of claim 1, at least one of the plurality of sections including busbars electrically coupling the photovoltaic portion of the section to the DC-DC converter of the section.

36. The integrated photovoltaic panel of claim 1, at least two of the plurality of sections comprising the same number of photovoltaic cell units.

37. The integrated photovoltaic panel of claim 1, at least two of the plurality of sections comprising a different number of photovoltaic cell units.

38. The integrated photovoltaic panel of claim 1, wherein:
the DC-DC converter of the first section is adapted to perform maximum power point tracking (MPPT) on the photovoltaic portion of the first section; and
the DC-DC converter of the second section is adapted to perform MPPT on the photovoltaic portion of the second section.

39. The integrated photovoltaic panel of claim 1, the DC-DC converter of at least one of the plurality of sections being adapted to perform maximum power point tracking on the photovoltaic portion of the respective section.

40. The integrated photovoltaic panel of claim 1, at least one photovoltaic portion comprising:
a first photovoltaic cell unit having opposing top and bottom sides, the first photovoltaic cell unit including:
a first solderable area on the top side, and
a second solderable area on the bottom side;
a first ribbon wire attached to the first solderable area, the first solderable area and the first ribbon wire oriented according to a first axis; and
a second ribbon wire attached to the second solderable area, the second solderable area and the second ribbon wire oriented according to a second axis, the second axis being different from the first axis.

41. The integrated photovoltaic panel of claim 40, the first photovoltaic cell unit further including a third solderable area on the bottom side of the first photovoltaic unit cell, the third solderable area oriented according to the first axis.

42. The integrated photovoltaic panel of claim 40, the first axis being perpendicular to the second axis.

43. The integrated photovoltaic panel of claim 1, the photovoltaic unit cells of at least one photovoltaic portion being electrically coupled in series.

44. The integrated photovoltaic panel of claim 43, the photovoltaic unit cells of at least one photovoltaic portion being electrically coupled in series by ribbon wire.

45. The integrated photovoltaic panel of claim 1, at least one photovoltaic portion comprising:
first and second columns of photovoltaic cell units, each of the columns including one or more photovoltaic cell units electrically coupled in series; and
one or more electrical conductors electrically coupling an end photovoltaic cell unit of the first column to an end photovoltaic cell unit of the second column.

46. The integrated photovoltaic panel of claim 1, the DC-DC converter of at least one of the one or more sections further comprising an output capacitor electrically coupled across the output port of the DC-DC converter.

47. The integrated photovoltaic panel of claim 1, the photovoltaic portion of at least one of the one or more sections comprising a number of photovoltaic cell units selected from the group consisting of six photovoltaic cell units, eight photovoltaic cell units, ten photovoltaic cell units, twelve photovoltaic cell units, twenty photovoltaic cell units and twenty four photovoltaic cell units.

48. The integrated photovoltaic panel of claim 1, the substrate being formed of a material selected from the group consisting of glass and a transparent polymeric material.

49. The integrated photovoltaic panel of claim 1, the material sealing each PV cell unit and each DC-DC converter to the substrate comprising laminating material.

50. The integrated photovoltaic panel of claim 49, the laminating material comprising one or more layers of ethylene vinyl acetate.

51. The integrated photovoltaic panel of claim 1, further comprising a back barrier layer disposed on the material sealing each PV cell unit and each DC-DC converter to the substrate, such that each PV cell unit and each DC-DC converter are disposed between the back barrier layer and the substrate.

52. The integrated photovoltaic panel of claim 51, the back barrier layer comprising polyvinyl fluoride.

* * * * *